US009257640B2

(12) United States Patent
Arayashiki et al.

(10) Patent No.: US 9,257,640 B2
(45) Date of Patent: Feb. 9, 2016

(54) MEMORY DEVICE AND METHOD FOR MANUFACTURING THE SAME

(71) Applicant: Kabushiki Kaisha Toshiba, Minato-ku (JP)

(72) Inventors: Yusuke Arayashiki, Mie-ken (JP); Kensuke Takahashi, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/168,352

(22) Filed: Jan. 30, 2014

(65) Prior Publication Data
US 2015/0069318 A1 Mar. 12, 2015

Related U.S. Application Data

(60) Provisional application No. 61/877,002, filed on Sep. 12, 2013.

(51) Int. Cl.
*H01L 45/02* (2006.01)
*H01L 45/00* (2006.01)
*H01L 27/24* (2006.01)

(52) U.S. Cl.
CPC .......... *H01L 45/085* (2013.01); *H01L 27/2481* (2013.01); *H01L 45/1233* (2013.01); *H01L 45/1266* (2013.01); *H01L 45/145* (2013.01); *H01L 45/16* (2013.01); *H01L 45/1675* (2013.01)

(58) Field of Classification Search
CPC .............. H01L 45/085; H01L 45/1633; H01L 45/1675; H01L 45/16; H01L 27/2481
See application file for complete search history.

(56) References Cited

U.S. PATENT DOCUMENTS

| 2008/0062740 | A1* | 3/2008 | Baek et al. ..................... 365/148 |
| 2010/0187493 | A1* | 7/2010 | Takahashi ......................... 257/4 |
| 2011/0240948 | A1 | 10/2011 | Kagawa |
| 2012/0063201 | A1 | 3/2012 | Hayakawa et al. |

FOREIGN PATENT DOCUMENTS

| JP | 2008-42033 | 2/2008 |
| JP | 2009-130344 | 6/2009 |
| JP | 2011-54646 | 3/2011 |

\* cited by examiner

*Primary Examiner* — Tran Tran
(74) *Attorney, Agent, or Firm* — Oblon, McClelland, Maier & Neustadt, L.L.P.

(57) ABSTRACT

A memory device according to an embodiment includes an ion metal layer, an opposing electrode, and a resistance change layer. The ion metal layer contains a first metal and a second metal. The resistance change layer is disposed between the ion metal layer and the opposing electrode. The first metal is able to move repeatedly through an interior of the resistance change layer. The concentration of the first metal in a central portion of the ion metal layer is higher than the concentration of the first metal in an end portion of the ion metal layer.

10 Claims, 20 Drawing Sheets

MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 61/877,002, filed on Sep. 12, 2013; the entire contents of which are incorporated herein by reference.

FIELD

Embodiments described herein relate generally to a memory device and a method for manufacturing the same.

BACKGROUND

In recent years, a memory device has been proposed in which a high-resistance film is provided between a metal film and an opposing electrode and the electrical resistance value of the high-resistance film is changed by causing ions of the metal included in the metal film to diffuse inside the high-resistance film to cause filaments to form or disappear. In such a memory device, it is necessary to shrink the structure to increase the bit density. However, it is a problem that the characteristics become unstable when the structure is shrunk.

DETAILED DESCRIPTION

Embodiments of the invention will now be described with reference to the drawings.

A memory device according to an embodiment includes an ion metal layer, an opposing electrode, and a resistance change layer. The ion metal layer contains a first metal and a second metal. The resistance change layer is disposed between the ion metal layer and the opposing electrode. The first metal is able to move repeatedly through an interior of the resistance change layer. The concentration of the first metal in a central portion of the ion metal layer is higher than the concentration of the first metal in an end portion of the ion metal layer.

A method for manufacturing a memory device according to an embodiment includes stacking an opposing electrode, a resistance change layer, and an ion metal layer. The ion metal layer contains a first metal and a second metal. The first metal is able to move repeatedly through the resistance change layer. The method includes patterning the ion metal layer to form a first exposed surface. The method includes performing oxidation treatment or nitriding treatment to cause the first metal to move in a direction away from the first exposed surface of the ion metal layer.

First Embodiment

First, a first embodiment will be described.

Figure 1:
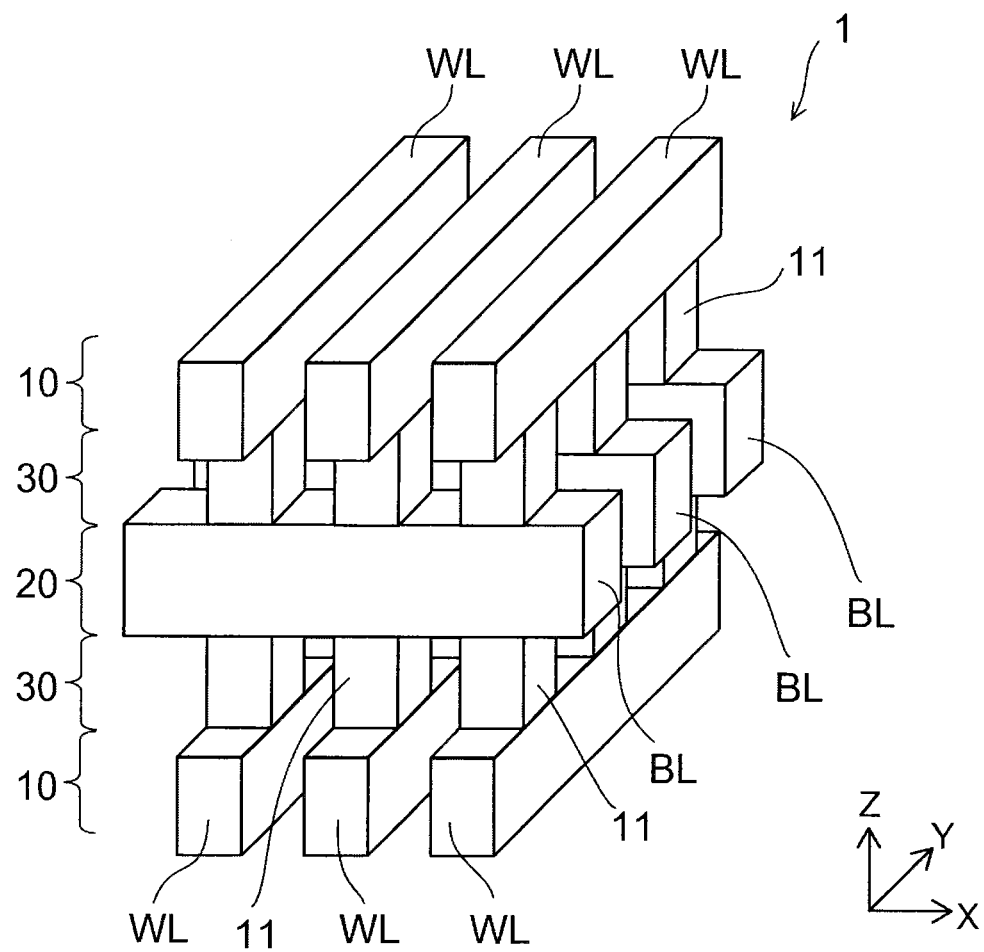
FIG. 1 is a perspective view showing a memory device according to a first embodiment.

FIG. 1 is a perspective view showing the memory device according to the embodiment.

Figure 2:
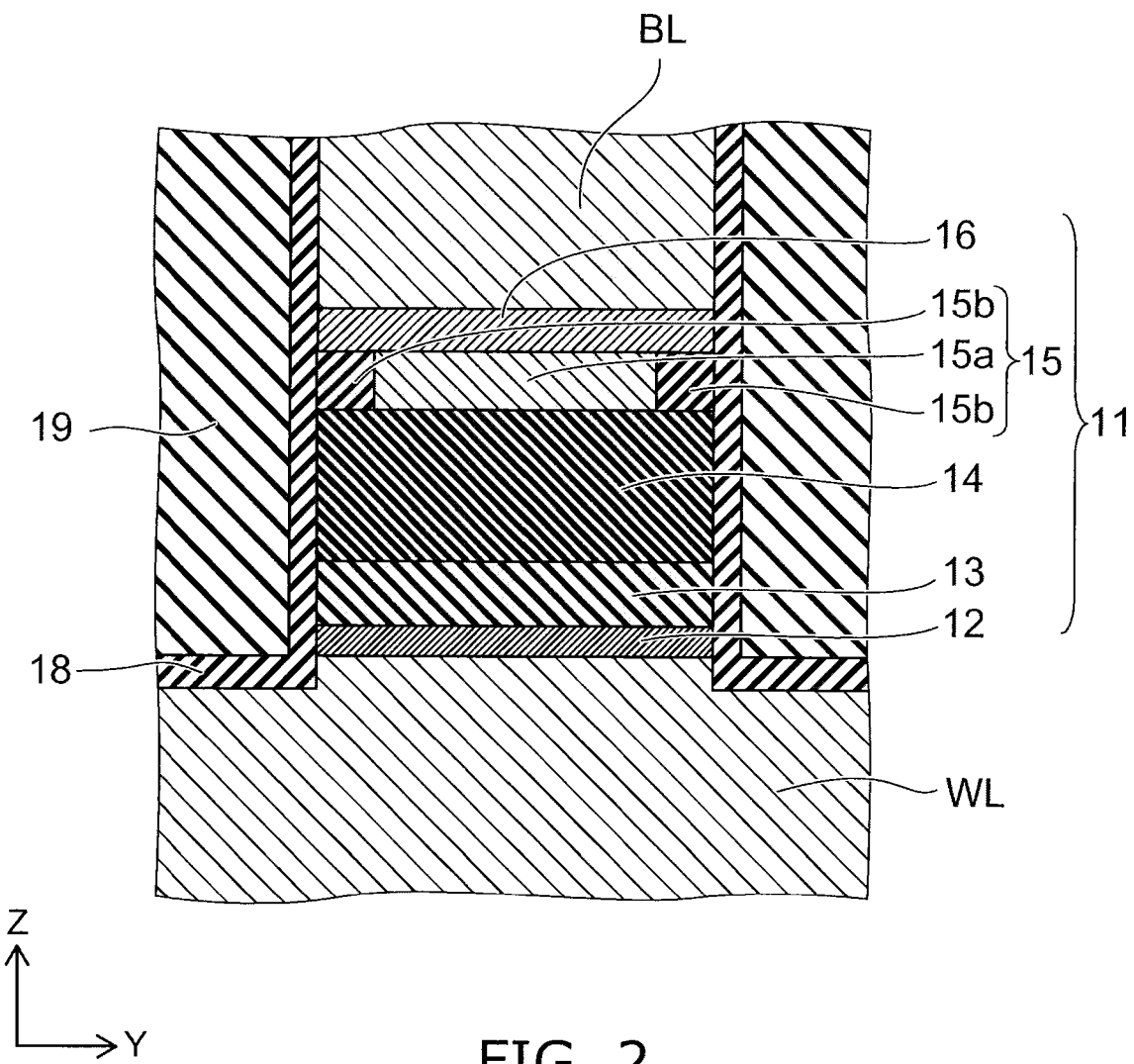
FIG. 2 is a cross-sectional view showing a region around a pillar of the memory device according to the first embodiment.

FIG. 2 is a cross-sectional view showing the region around a pillar of the memory device according to the embodiment.

The memory device according to the embodiment is a Conduction bridge RAM (CBRAM) which is one type of resistance random access memory device (ReRAM).

As shown in FIG. 1, a word line interconnect layer 10 and a bit line interconnect layer 20 are stacked alternately along a vertical direction (a Z-direction) in the memory device 1 according to the embodiment. A memory cell layer 30 is provided between the word line interconnect layer 10 and the bit line interconnect layer 20. Although only two layers of the word line interconnect layer 10 and one layer of the bit line interconnect layer 20 are shown in FIG. 1, this is not limited thereto; and more word line interconnect layers 10 and bit line interconnect layers 20 may be stacked alternately.

Multiple word lines WL that extend in one direction (a Y-direction) are provided in each of the word line interconnect layers 10. Multiple bit lines BL that extend in one other direction (an X-direction) are provided in each of the bit line interconnect layers 20. The X-direction, the Y-direction, and the Z-direction intersect each other, e.g., are orthogonal to each other. In each of the memory cell layers 30, pillars 11 that extend in the Z-direction are provided between the word lines WL and the bit lines BL. In other words, in each of the memory cell layers 30, the multiple pillars 11 are arranged in a matrix configuration along the X-direction and the Y-direction. Also, an inter-layer insulating film 19 (referring to FIG. 2) is disposed between the word lines WL, between the bit lines BL, and between the pillars 11. However, the inter-layer insulating film 19 is not shown for convenience of illustration in FIG. 1.

In each of the pillars 11 as shown in FIG. 2, a barrier metal layer 12, a lower layer electrode layer (a current-limiting layer) 13, a resistance change layer 14, an ion metal layer 15, and a barrier metal layer 16 are stacked in this order from the word line WL toward the bit line BL. Also, a liner film 18 is provided on the side surface of the pillar 11; and the inter-layer insulating film 19 is provided around the liner film 18.

Although the ion metal layer 15 is disposed to be higher than the resistance change layer 14 because the pillar 11 shown in FIG. 2 is a pillar 11 for which the word line WL is disposed below and the bit line BL is disposed above, the ion metal layer 15 is disposed to be lower than the resistance change layer 14 in the case of a pillar 11 for which the bit line BL is disposed below and the word line WL is disposed above. In other words, inside each of the pillars 11, the ion metal layer 15 is disposed to be relatively on the bit line BL side; and the resistance change layer 14 is disposed to be relatively on the word line WL side. The word line WL functions as an opposing electrode. Unlike FIG. 2, inside each of the pillars 11, the ion metal layer 15 may be disposed to be relatively on the word line WL side; and the resistance change layer 14 may be disposed to be relatively on the bit line BL side.

An example of the materials of the components will now be described. The word line WL and the bit line BL are formed of, for example, tungsten (W). The barrier metal layers 12 and 16 are formed of, for example, titanium nitride (TiN), tantalum nitride (TaN), or tungsten nitride (WN). The liner film 18 is formed of, for example, silicon nitride ($Si_3N_4$); and the inter-layer insulating film 19 is formed of, for example, silicon oxide ($SiO_2$).

The ion metal layer 15 is a layer for forming a filament by supplying a metal to the resistance change layer 14 and contains a first metal, a second metal, and oxygen (O). The first metal is ionized easily and is a metal that is able to move repeatedly through the resistance change layer 14. The second metal is a metal that is oxidized more easily than the first metal. The first metal is, for example, silver (Ag); and the second metal is, for example, titanium (Ti). In other words, the ion metal layer 15 is formed of, for example, a silver-titanium alloy including oxygen.

The resistance change layer 14 is a layer in which a filament is formed of the metal that moves from the ion metal layer 15. The first metal described above is diffusible in the resistance change layer 14; and the resistance change layer 14 is formed of a material having a resistivity that is higher than that of the first metal or a material that is insulative, e.g., silicon oxide ($SiO_2$). The resistance change layer 14 is not limited to a single-layer structure and may be a stacked structure film having two layers or more. The lower layer electrode layer 13 is formed of a material in which the first metal described above is diffusible.

The lower layer electrode layer 13 is a current-limiting layer for preventing short defects due to overcurrent in the set operation of the memory cell and is a layer having a resistance value that is about within the operation voltage range of the memory device 1. The resistance value that is necessary for the lower layer electrode layer 13 is determined by the design of the memory device 1, but is about 1 MΩ to 1 GΩ. For example, the lower layer electrode layer 13 may be a layer that is formed of amorphous silicon or polysilicon for which the thickness is adjusted to have the desired resistance value, or may be a layer that is formed of tantalum aluminum nitride (TaAlN) or tantalum silicon nitride (TaSiN) for which the thickness or composition is adjusted to have the desired resistance value. According to the design of the memory device 1, the lower layer electrode layer 13 may be omitted. In the embodiment, the lower layer electrode layer 13 is formed of, for example, polysilicon.

Figure 3:
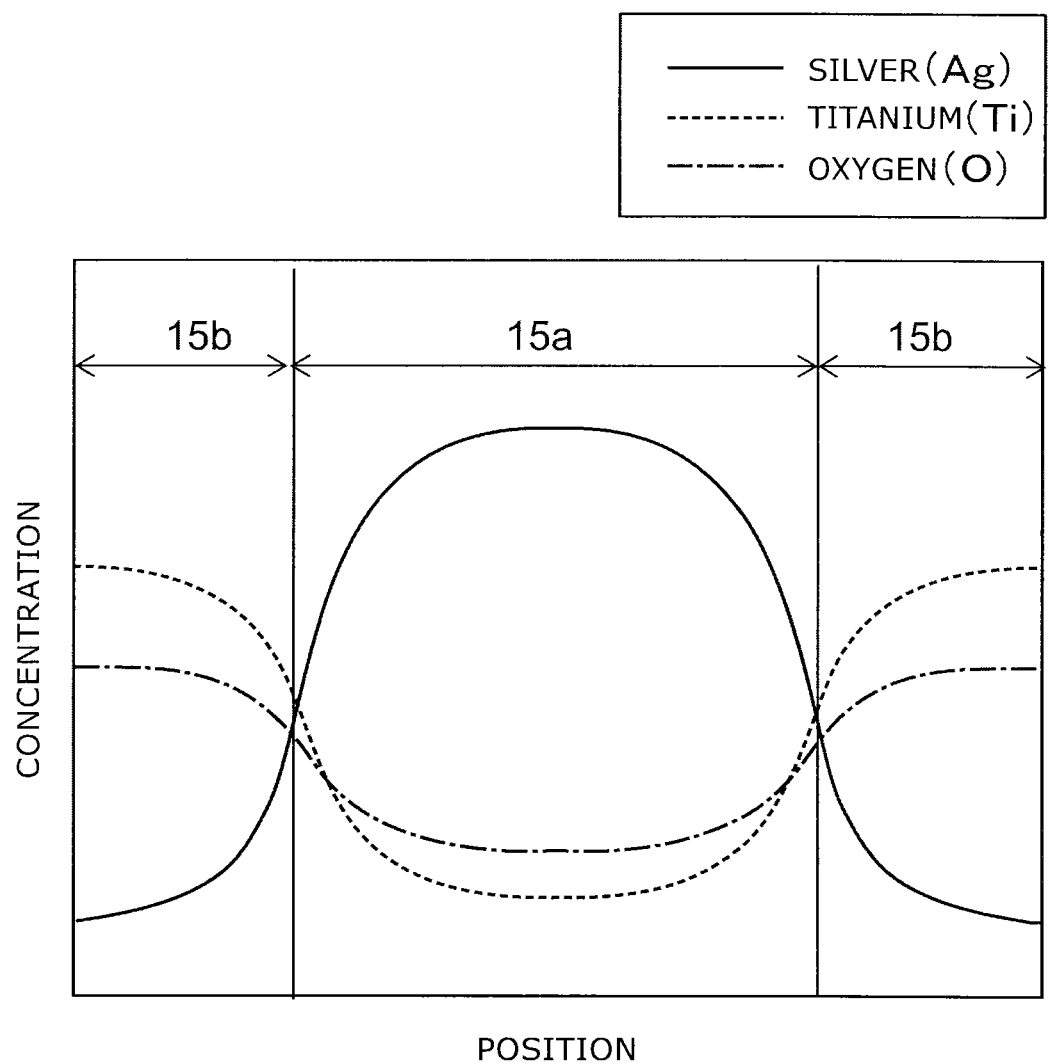
FIG. 3 is a graph showing the composition distribution of the ion metal layer, in which the horizontal axis is the position in the X-direction and the Y-direction, and the vertical axis is the concentration.

FIG. 3 is a graph showing the composition distribution of the ion metal layer, in which the horizontal axis is the position in the X-direction and the Y-direction, and the vertical axis is the concentration.

Inside ion metal layer 15 as shown in FIG. 3, the silver (Ag) concentration, the titanium (Ti) concentration, and the oxygen (O) concentration have distributions in the X-direction and the Y-direction. In both the X-direction and the Y-direction, the silver concentration is relatively high in a central portion 15a of the ion metal layer 15 and relatively low in a peripheral portion 15b of the ion metal layer 15. The peripheral portion 15b is a portion that has an annular configuration around the central portion 15a. The titanium concentration and the oxygen concentration are relatively low in the central portion 15a of the ion metal layer 15 and relatively high in the peripheral portion 15b of the ion metal layer 15. In other words, much simple silver exists in the central portion 15a of the ion metal layer 15; and much oxidized titanium exists in the peripheral portion 15b of the ion metal layer 15.

A method for manufacturing the memory device according to the embodiment will now be described.

FIG. 4 to FIG. 12 are perspective cross-sectional views showing the method for manufacturing the memory device according to the embodiment.

Figure 4:
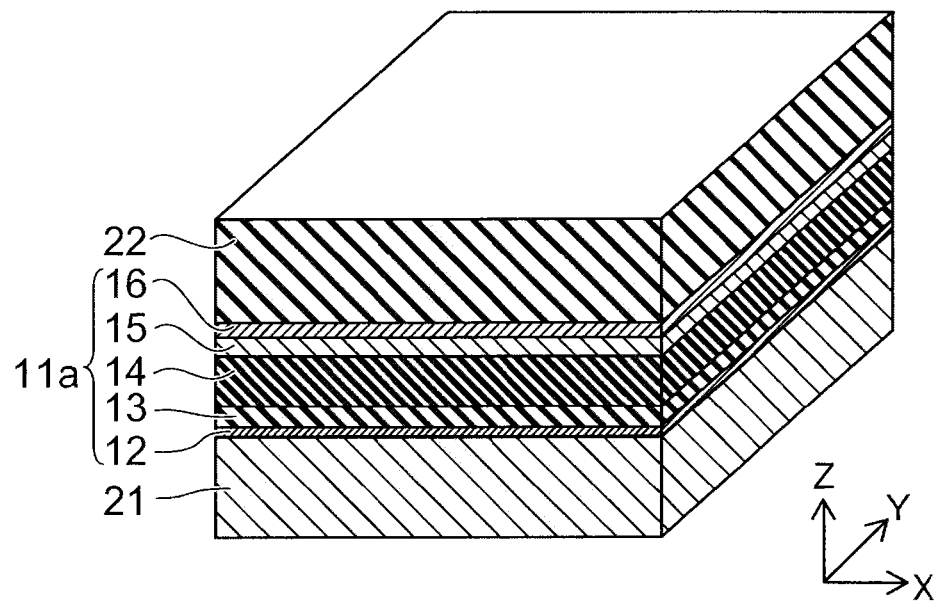
FIG. 4 to FIG. 12 are perspective cross-sectional views showing a method for manufacturing the memory device according to the first embodiment.

First, as shown in FIG. 4, an inter-layer insulating film (not shown) is formed on a silicon substrate (not shown); and a conductive film 21 is formed on the entire surface by depositing, for example, tungsten on the inter-layer insulating film. Then, a stacked film 11a is formed on the entire surface of the conductive film 21 by stacking the barrier metal layer 12, the lower layer electrode layer 13, the resistance change layer 14, the ion metal layer 15, and the barrier metal layer 16 in this order. Then, a hard mask 22 is formed on the stacked film 11a. The hard mask 22 is formed of, for example, silicon oxide or silicon nitride.

Figure 5:
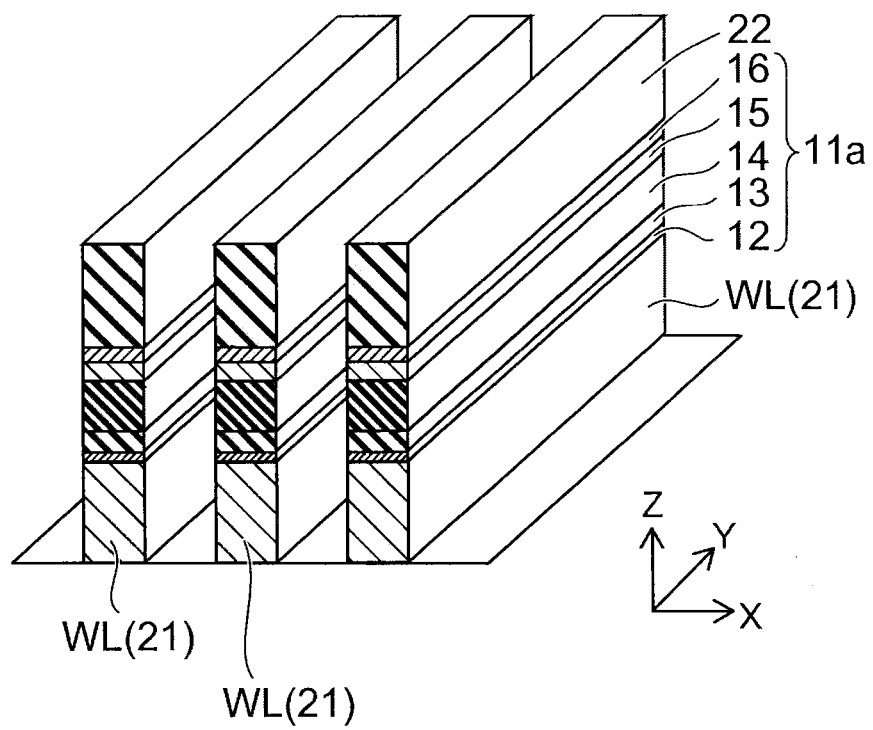

Then, as shown in FIG. 5, the hard mask 22 is patterned into a line-and-space configuration extending in the Y-direction by lithography. Then, the stacked film 11a and the conductive film 21 are patterned by performing anisotropic etching such as RIE (reactive ion etching), etc., using the hard mask 22 as a mask. Thereby, the stacked film 11a is patterned into a line configuration extending in the Y-direction. Also, the conductive film 21 is patterned into a line configuration extending in the Y-direction to become the multiple word lines WL. At this time, the patterned surfaces, i.e., the side surfaces on the two X-direction facing sides, of the resistance change layer 14 are damaged.

Then, the side surfaces of the stacked film 11a are oxidized by performing oxidation treatment. For example, the oxidation treatment is a low-temperature thermal oxidation treatment in which heating is performed in an oxidation atmosphere to a temperature, e.g., a temperature of not more than 400° C., such that the silver inside the ion metal layer 15 does not migrate outside the ion metal layer 15. Thereby, titanium, which is oxidized more easily than silver, is preferentially oxidized at the vicinity of the patterned surfaces, i.e., the side surfaces on the two X-direction facing sides, of the ion metal layer 15. On the other hand, the silver existing at the side surface vicinity of the ion metal layer 15 destabilizes due to the oxygen atoms approaching the vicinity of the silver and migrates to positions distal to the side surfaces. As a result, as in FIG. 3, the proportions of titanium and oxygen inside the ion metal layer 15 become high at the vicinity of the side surfaces on the two X-direction facing sides of the ion metal layer 15; and on the other hand, the proportion of silver increases at the central vicinity of the ion metal layer 15 in the X-direction.

Figure 6:
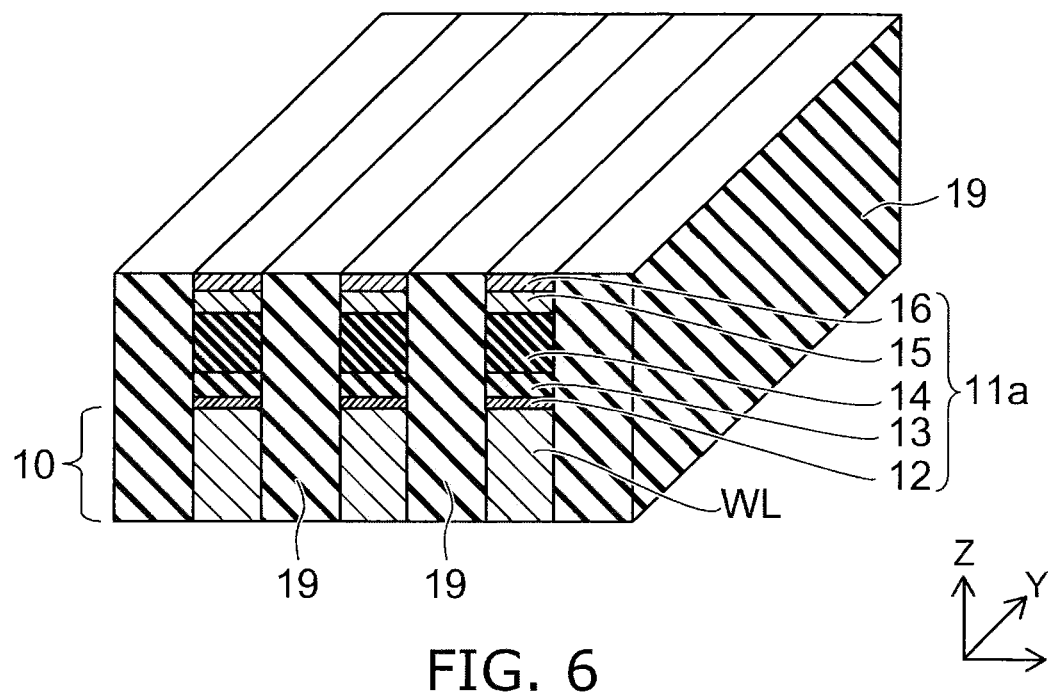

Then, as shown in FIG. 6, silicon oxide is deposited after forming the liner film 18 (referring to FIG. 2) on the entire surface. Then, CMP (chemical mechanical polishing) is performed using the barrier metal layer 16 as a stopper. Thereby, the hard mask 22 is removed; and the inter-layer insulating film 19 is filled between the stacked film 11a patterned into the line configuration. As a result, the word line interconnect layer 10 in which the word lines WL and the inter-layer insulating film 19 are arranged alternately, and a structural body in which the inter-layer insulating film 19 and the stacked film 11a having the line configuration are arranged alternately, are formed.

Figure 7:
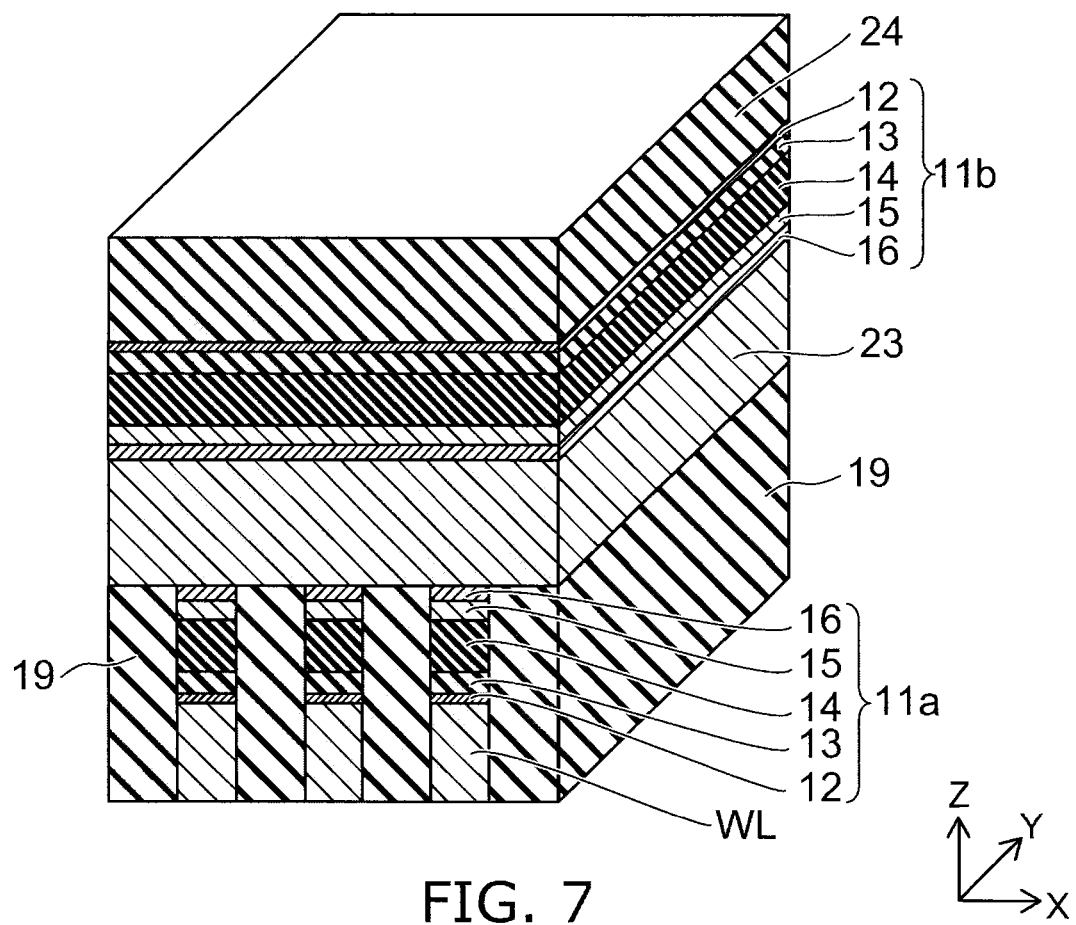

Then, as shown in FIG. 7, a conductive film 23 is formed on the entire surface by depositing, for example, tungsten. Then, a stacked film 11b is formed by stacking the barrier metal layer 16, the ion metal layer 15, the resistance change layer 14, the lower layer electrode layer 13, and the barrier metal layer 12 in this order. Then, a hard mask 24 is formed.

Figure 8:
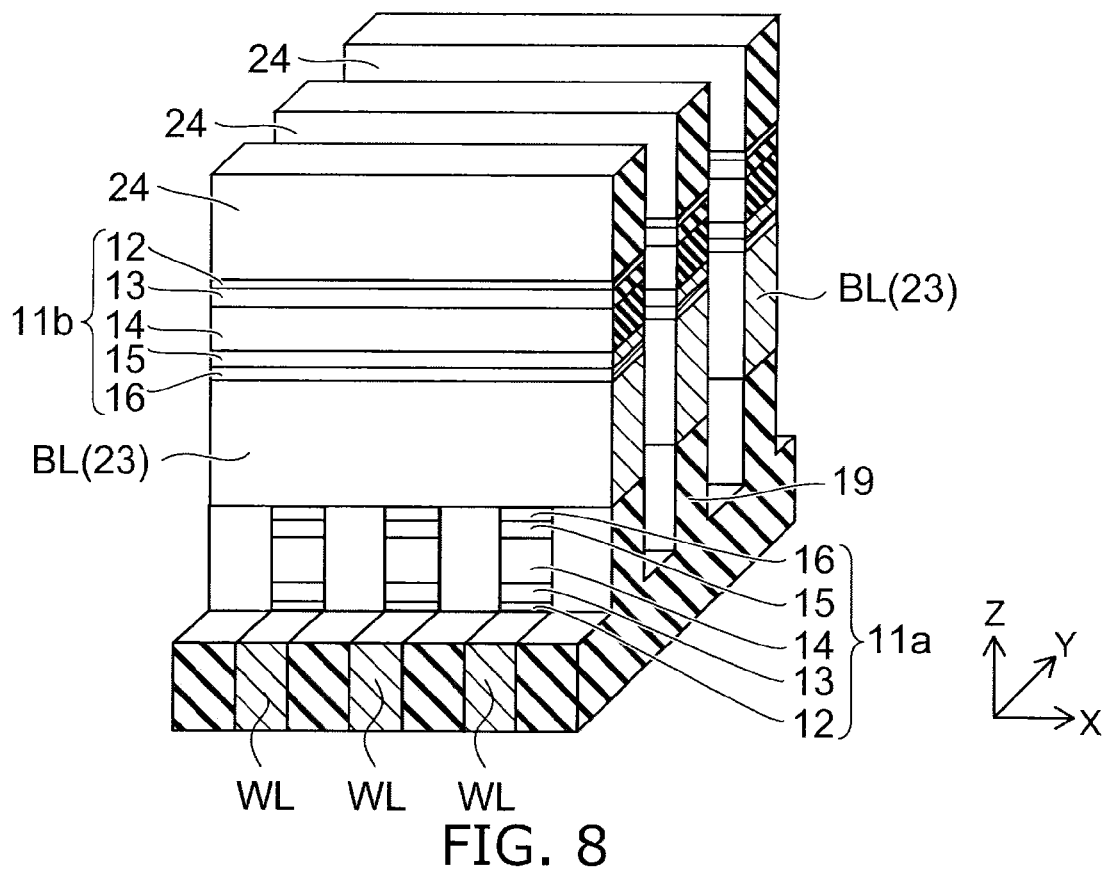

Then, as shown in FIG. 8, the hard mask 24 is patterned into a line-and-space configuration extending in the X-direction by lithography. Then, the stacked film 11b, the conductive film 23, and the stacked film 11a are patterned by performing anisotropic etching such as RIE, etc., using the hard mask 24 as a mask.

Thereby, the stacked film 11b is patterned into a line configuration extending in the X-direction. Also, the conductive film 23 is patterned into a line configuration extending in the X-direction to become the multiple bit lines BL. Further, the stacked film 11a that is already patterned into the line configuration extending in the Y-direction is divided in the Y-direction. Thereby, the stacked film 11a is divided along both the X-direction and the Y-direction to be patterned into the multiple pillars 11 arranged in a matrix configuration. At this time, the patterned surfaces, i.e., the side surfaces on the two Y-direction facing sides, of the resistance change layers 14 that are included in the stacked film 11b and the pillars 11 are damaged.

Then, the side surfaces of the pillars 11 and the stacked film 11b are oxidized by performing oxidation treatment. The oxidation treatment is a low-temperature thermal oxidation treatment at a temperature of, for example, not more than 400° C. Thereby, titanium, which is oxidized more easily than silver, is preferentially oxidized at the vicinity of the patterned surfaces, i.e., the side surfaces on the two Y-direction facing sides, of the ion metal layer 15. On the other hand, the silver that exists at the side surface vicinity of the ion metal layer 15 destabilizes due to the oxygen atoms approaching the vicinity of the silver and migrates to positions distal to the side surfaces. As a result, as in FIG. 3, the proportions of titanium and oxygen inside the ion metal layer 15 increase at the vicinity of the side surfaces on the two Y-direction facing sides of the ion metal layer 15; and on the other hand, the proportion of silver increases at the central vicinity of the ion metal layer 15 in the Y-direction. As a result, the composition distribution of the ion metal layer 15 that is included in the pillars 11 is a distribution such that the titanium concentration and the oxygen concentration are relatively high at the peripheral portion 15b and the silver concentration is relatively high at the central portion 15a as shown in FIG. 3. Also, at the peripheral portion of the ion metal layer 15, the physical film thickness increases due to the titanium being oxidized.

Figure 9:
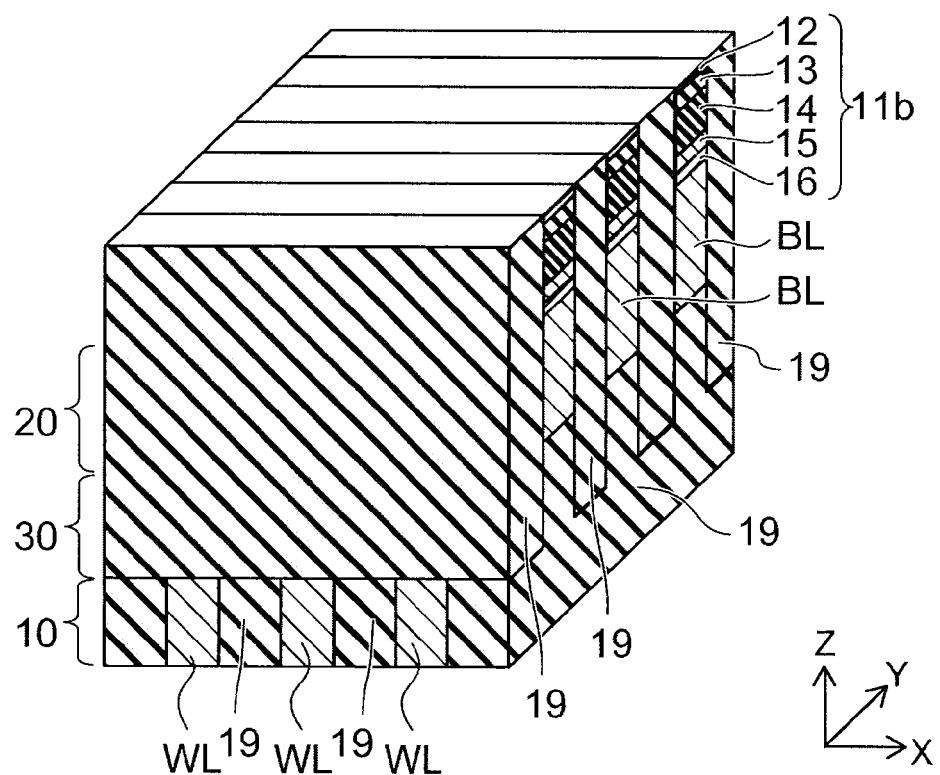

Then, as shown in FIG. 9, silicon oxide is deposited after forming the liner film 18 (referring to FIG. 2) on the entire surface. Then, CMP is performed using the barrier metal layer 12 of the stacked film 11b as a stopper. Thereby, the hard mask 24 is removed; and the inter-layer insulating film 19 is filled between the pillars 11 and between the stacked film 11b patterned into the line configuration. As a result, the memory cell layer 30 in which the pillars 11 are arranged in a matrix configuration inside the inter-layer insulating film 19, the bit line interconnect layer 20 in which the bit lines BL and the inter-layer insulating film 19 are arranged alternately, and a structural body in which the inter-layer insulating film 19 and the stacked film 11b patterned into the line configuration are arranged alternately, are formed.

Figure 10:
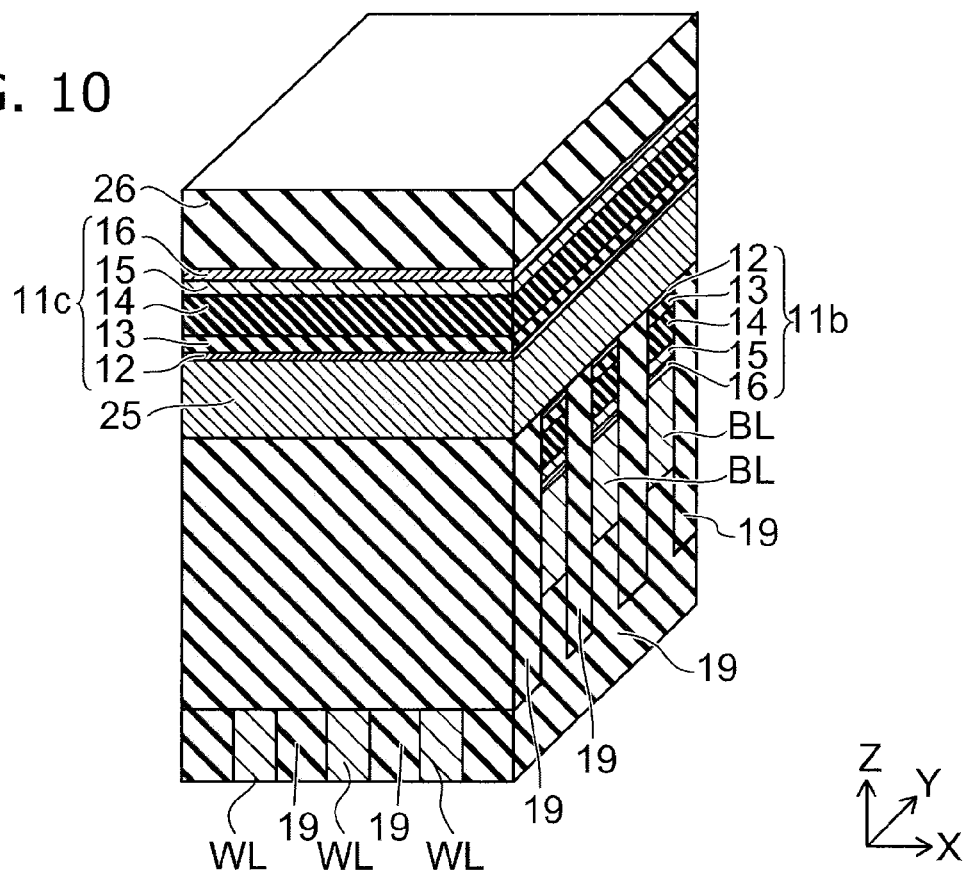

Then, as shown in FIG. 10, a conductive film 25 is formed by depositing, for example, tungsten on the entire surface. Then, a stacked film 11c is formed on the entire surface by stacking the barrier metal layer 12, the lower layer electrode layer 13, the resistance change layer 14, the ion metal layer 15, and the barrier metal layer 16 in this order. Then, a hard mask 26 is formed.

Figure 11:
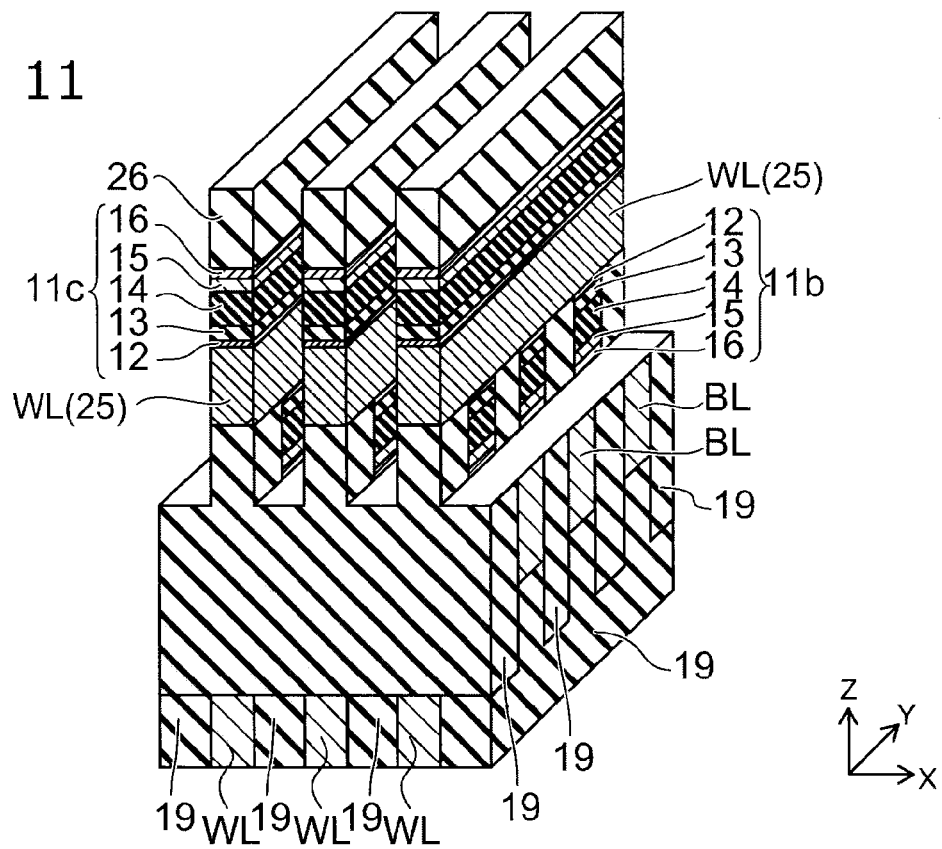

Then, as shown in FIG. 11, the hard mask 26 is patterned into a line-and-space configuration extending in the Y-direction by lithography. Then, the stacked film 11c, the conductive film 25, and the stacked film 11b are patterned by performing anisotropic etching such as RIE, etc., using the hard mask 26 as a mask.

Thereby, the stacked film 11c is patterned into a line configuration extending in the Y-direction. Also, the conductive film 25 is patterned into a line configuration extending in the Y-direction to become the multiple word lines WL. Further, the stacked film 11b that is already patterned into the line configuration extending in the X-direction is divided in the X-direction. Thereby, the stacked film 11b is divided along both the X-direction and the Y-direction to be patterned into the multiple pillars 11 arranged in a matrix configuration. At this time, the patterned surfaces, i.e., the side surfaces on the two X-direction facing sides, of the resistance change layers 14 that are included in the stacked film 11c and the pillars 11 are damaged.

Then, the side surfaces of the stacked film 11c and the pillars 11 patterned from the stacked film 11b are oxidized by performing oxidation treatment. The oxidation treatment is a low-temperature thermal oxidation treatment at a temperature of, for example, not more than 400° C. Thereby, similarly to the oxidation treatment described above, titanium, which is oxidized more easily than silver, is preferentially oxidized at the vicinity of the patterned surfaces, i.e., the side surfaces on the two X-direction facing sides, of the ion metal layers 15 that are included in the pillars 11 and the stacked film 11c. Also, the silver atoms positioned at the side surface vicinity migrate in a direction away from the side surfaces. As a result, the composition distribution of the ion metal layer 15 that is included in the pillars 11 becomes a distribution such as that shown in FIG. 3. Further, at the peripheral portion of the ion metal layer 15, the physical film thickness increases due to the titanium being oxidized.

Figure 12:
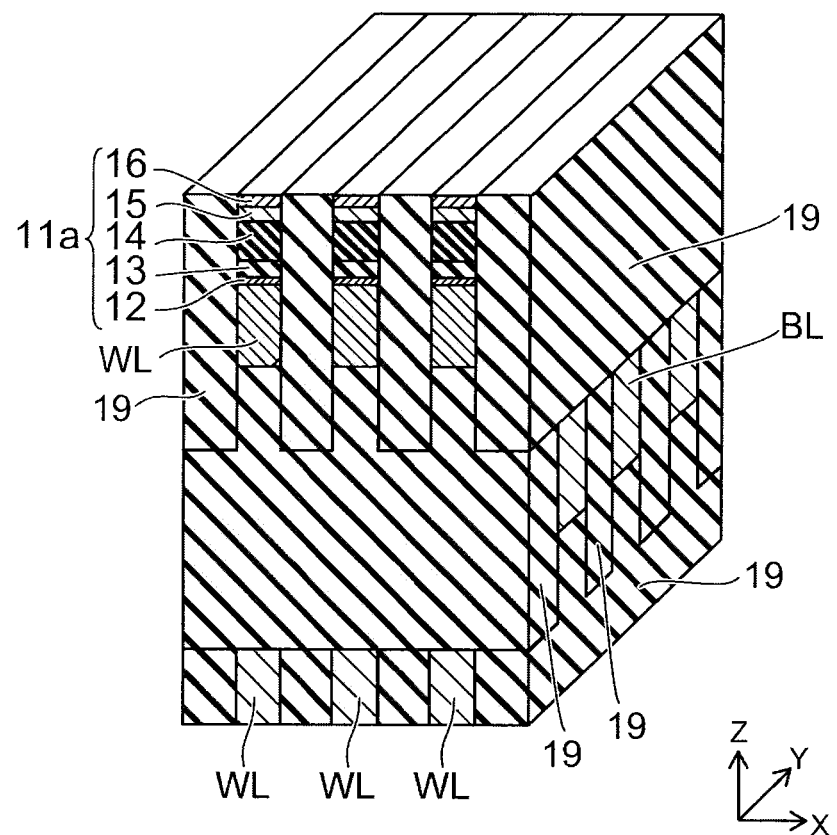

Then, as shown in FIG. 12, silicon oxide is deposited after forming the liner film 18 (referring to FIG. 2) on the entire surface. Then, CMP is performed using the barrier metal layer 16 of the uppermost layer as a stopper. Thereby, the hard mask 26 is removed; and the inter-layer insulating film 19 is filled between the pillars 11 and between the stacked film 11c patterned into the line configuration.

Thereafter, similarly, the process of forming a conductive film and a stacked film on the entire surface of the stacked film that includes the resistance change layer 14 and the ion metal layer 15 and is patterned into the line configuration extending in the one direction and the process of patterning the stacked film of the upper layer, the conductive film, and the stacked film of the lower layer into a line configuration extending in one other direction are repeated. Thereby, the word lines WL that extend in the Y-direction, the pillars 11, the bit lines BL that extend in the X-direction, and the pillars 11 can be formed repeatedly; and the memory device 1 can be manufactured.

Operations and effects of the memory device according to the embodiment will now be described.

Figure 13:
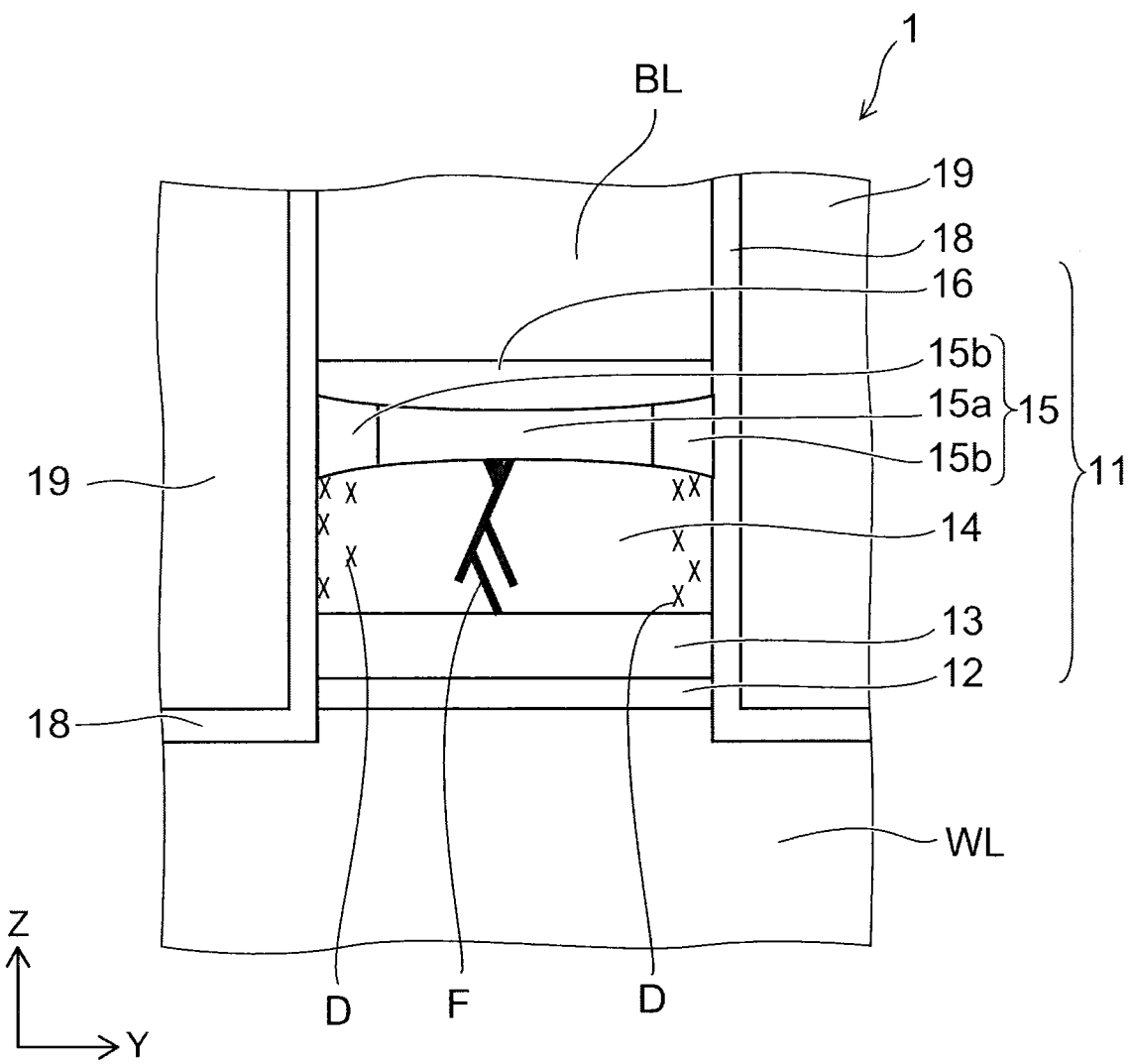
FIG. 13 is a schematic cross-sectional view showing an operation of the memory device according to the first embodiment.

FIG. 13 is a schematic cross-sectional view showing an operation of the memory device according to the embodiment.

First, the basic memory operation will be described.

As shown in FIG. 13, when a voltage (hereinbelow, called the "positive voltage") that causes the word line WL to be negative and the bit line BL to be positive is applied to the pillar 11, a portion of the silver atoms included in the ion metal layer 15 ionizes to become positive ions. Then, the positive ions move toward the word line WL which is negative and enter the resistance change layer 14. Then, these bond with the electrons supplied from the word line WL inside the resistance change layer 14 and precipitate as silver atoms. Thereby, a filament F made of mainly silver is formed inside the resistance change layer 14 to pierce these layers. As a result, the filament F becomes a current path; and the pillar 11 is switched to the "low resistance state." This operation is called "setting."

On the other hand, when a voltage (hereinbelow, called the "reverse voltage") that causes the word line WL to be positive and the bit line BL to be negative is applied to the pillar 11, the silver that forms the filament F is ionized to become positive ions that move toward the bit line BL. Then, these bond with electrons supplied from the bit line BL inside the ion metal layer 15 and again become silver atoms. Thereby, at least a portion of the filament F formed inside the resistance change layer 14 disappears; and the pillar 11 is switched to the "high resistance state." This operation is called "resetting."

Further, when the positive voltage that is applied to the pillar 11 is switched off directly after the set operation, a portion of the filament F that is formed inside the resistance change layer 14 decomposes. Therefore, a current path is not formed and a current does not flow even if a reverse voltage is applied to the pillar 11 in this state. On the other hand, when a positive voltage that is lower than the set voltage necessary for the set operation is applied to the pillar 11 as a read-out voltage, the portion of the filament F that had decomposed is re-formed; and a current flows. Thereby, the pillar 11 can be sensed to be in the low resistance state. Thus, the element that is made of the ion metal layer 15 and the resistance change layer 14 has a rectifying function.

The effects of oxidizing the patterned surfaces of the ion metal layer 15 will now be described.

In the memory device 1 according to the embodiment as shown in FIG. 13, damage D is introduced to the peripheral portion of the resistance change layer 14 when patterning the resistance change layer 14 in the manufacturing processes of the memory device 1. Therefore, the film quality of the peripheral portion of the resistance change layer 14 degrades. Then, in the case where the filament F is formed in the peripheral portion, the switching characteristics described above become unstable.

Therefore, in the embodiment, the oxidation treatment is performed after patterning stacked films 19a to 19c. Thereby, titanium, which is oxidized more easily than silver, is preferentially oxidized at the side surface vicinity of the ion metal layer 15. On the other hand, the silver at the side surface vicinity destabilizes due to the oxygen atoms approaching the vicinity of the silver and migrates to positions distal to the side surfaces. Thereby, a composition distribution such as that shown in FIG. 3 is realized.

Then, as described above, oxidation treatment is performed to cause the titanium and the oxygen to segregate to the peripheral portion 15b of the ion metal layer 15 and the silver to segregate to the central portion 15a of the ion metal layer 15 for both the two side surfaces of the ion metal layer 15 facing the Y-direction and the two side surfaces of the ion metal layer 15 facing the X-direction. Further, by the titanium being oxidized, the electrical resistivity is higher and the physical film thickness is greater for the peripheral portion 15b than for the central portion 15a. Therefore, the electric field formed in the peripheral portion of the ion metal layer 15 becomes weak. On the other hand, the electric field concentrates easily in the central portion 15a of the ion metal layer 15.

Thus, at the peripheral portion 15b of the ion metal layer 15, silver ions are not produced easily because there are few simple silver atoms and the applied electric field is weak. On the other hand, at the central portion 15a of the ion metal layer 15, silver ions are produced easily because there are many simple silver atoms and the electric field concentrates easily. As a result, the filament F is formed more easily at the central portion of the resistance change layer 14 than at the peripheral portion of the resistance change layer 14. Thereby, the switching characteristics of the pillar 11 stabilize because the filament F that is inside the resistance change layer 14 is formed in the central portion where there is little of the damage D.

An experimental example that illustrates these effects will now be described.

Figure 14A:
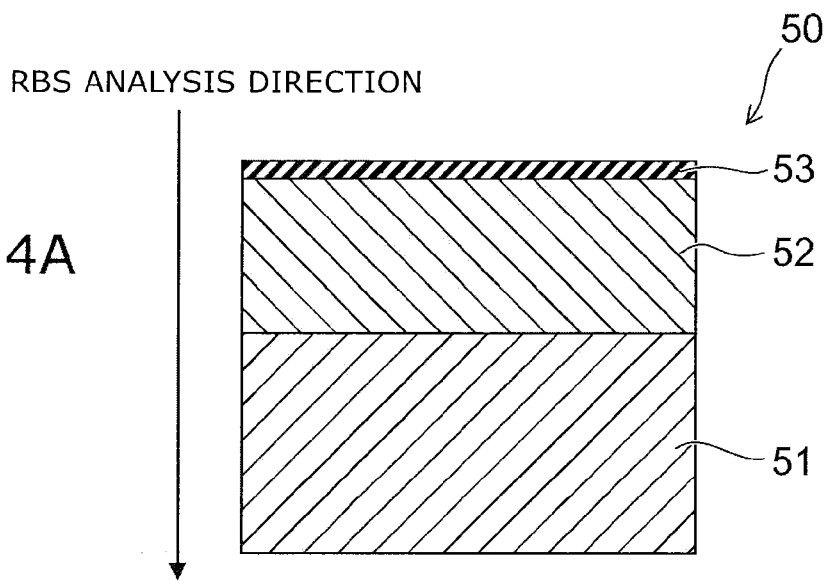
FIG. 14A is a cross-sectional view showing a sample used in an experimental example.
Figure 14B:
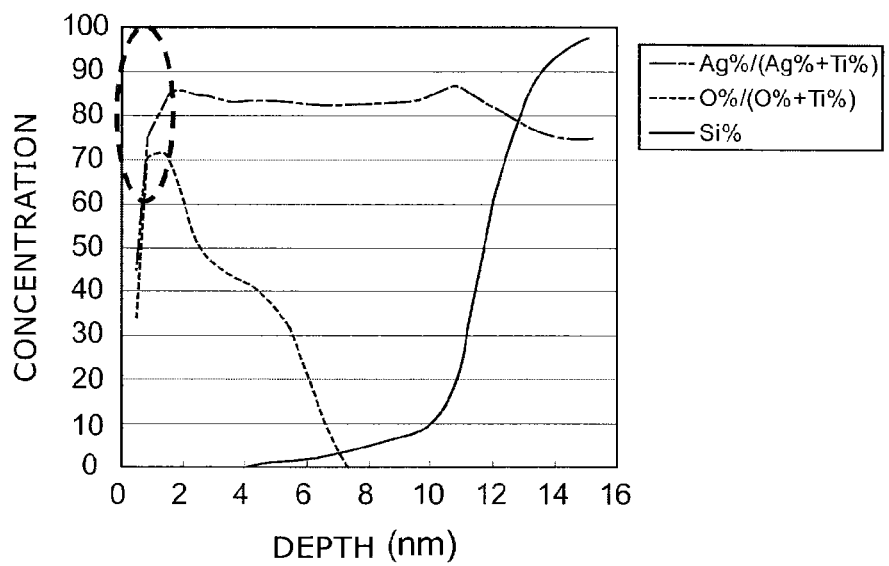
FIG. 14B and FIG. 14C are graphs showing composition distributions of the sample shown in FIG. 14A, in which the horizontal axis is the depth, and the vertical axis is the concentration.
Figure 14C:
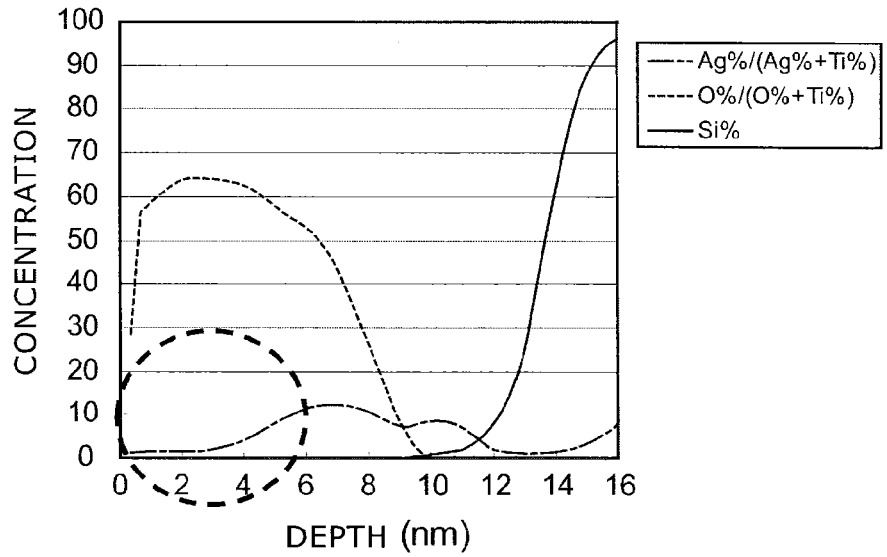

FIG. 14A is a cross-sectional view showing the sample used in the experimental example; and FIG. 14B and FIG. 14C are graphs showing composition distributions of the sample shown in FIG. 14A, in which the horizontal axis is the depth, and the vertical axis is the concentration.

In the experimental example as shown in FIG. 14A, a sample 50 was made by forming a silver-titanium alloy layer 52 on a silicon substrate 51. In this case, two types of compositions of the silver-titanium alloy layer 52 were the composition in which silver is 80 mass % and titanium is 20 mass % (Ag:Ti=80:20) and the composition in which silver is 20 mass % and titanium is 80 mass % (Ag:Ti=20:80). A native oxide film 53 that was made of mainly titanium oxide was formed on the silver-titanium alloy layer 52. Subsequently, the composition of the sample 50 was analyzed by RBS (Rutherford Backscattering spectrometry) from the upper surface side, i.e., the native oxide film 53 side. The results are shown in FIG. 14B and FIG. 14C. FIG. 14B shows the analysis result of the sample of the composition (Ag:Ti=80:20); and FIG. 14C shows the analysis result of the sample of the composition (Ag:Ti=20:80).

Focusing on the portions enclosed with the broken lines in FIG. 14B and FIG. 14C, it can be seen that in the sample 50, the concentration of silver decreases in the portion of the surface vicinity where the oxygen concentration is high. This indicates that the titanium concentration also is high in the portion where the oxygen concentration is high. The portion where the concentrations of titanium and oxygen are high corresponds to the native oxide film 53 that is formed between the forming of the alloy layer 52 and the analysis. Then, as illustrated by the portion shown in FIG. 14B where the depth is about 2 to 10 nm and the portion shown in FIG. 14C where the depth is about 6 to 11 nm, the concentration of silver was high in the portions positioned lower than the portions where the concentrations of titanium and oxygen were high. It is considered that this is because the bonds between the titanium atoms and the silver atoms were broken due to the titanium atoms preferentially bonding with the oxygen atoms and because the silver atoms moved to portions having few oxygen atoms. The experimental example explains the phenomenon of the memory device 1 according to the embodiment in which there is much titanium and oxygen in the peripheral portion 15b of the ion metal layer 15 and there is much silver in the central portion 15a of the ion metal layer 15.

Second Embodiment

A second embodiment will now be described.

Figure 15:
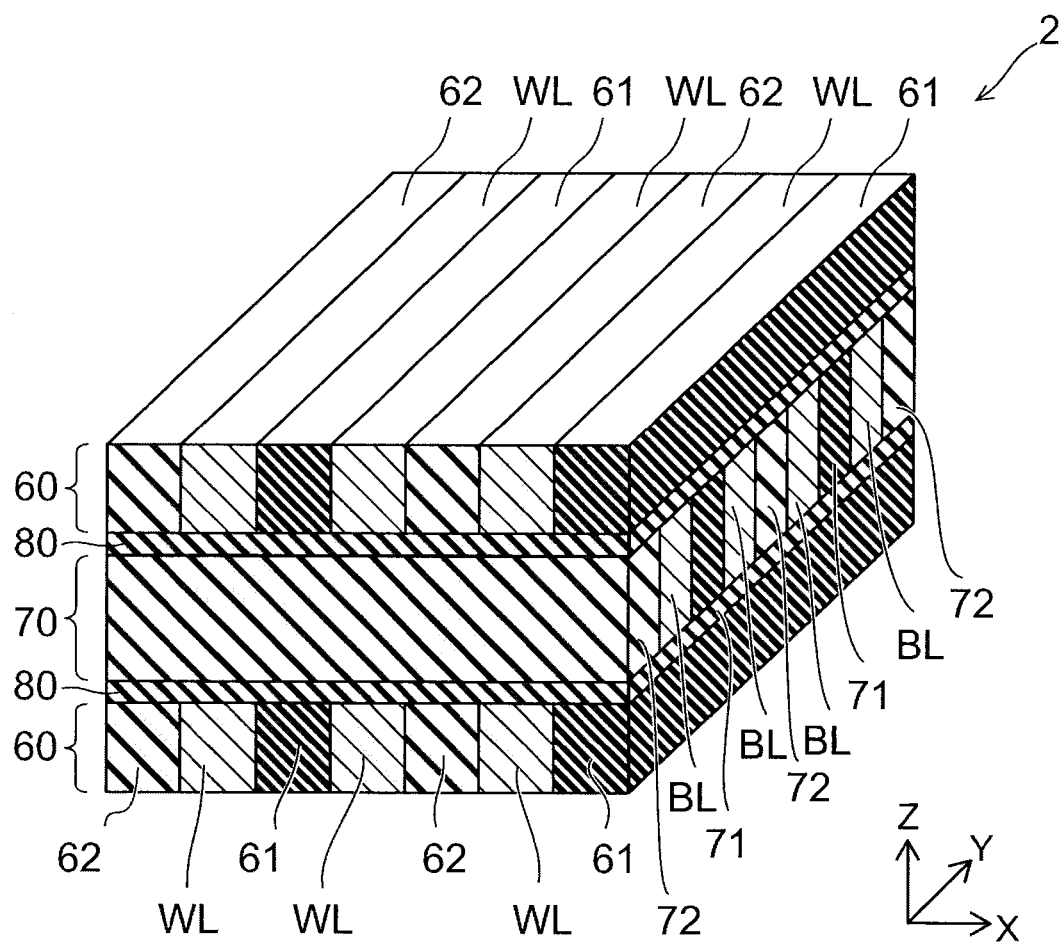
FIG. 15 is a perspective cross-sectional view showing a memory device according to a second embodiment.

FIG. 15 is a perspective cross-sectional view showing a memory device according to the embodiment.

Figure 16:
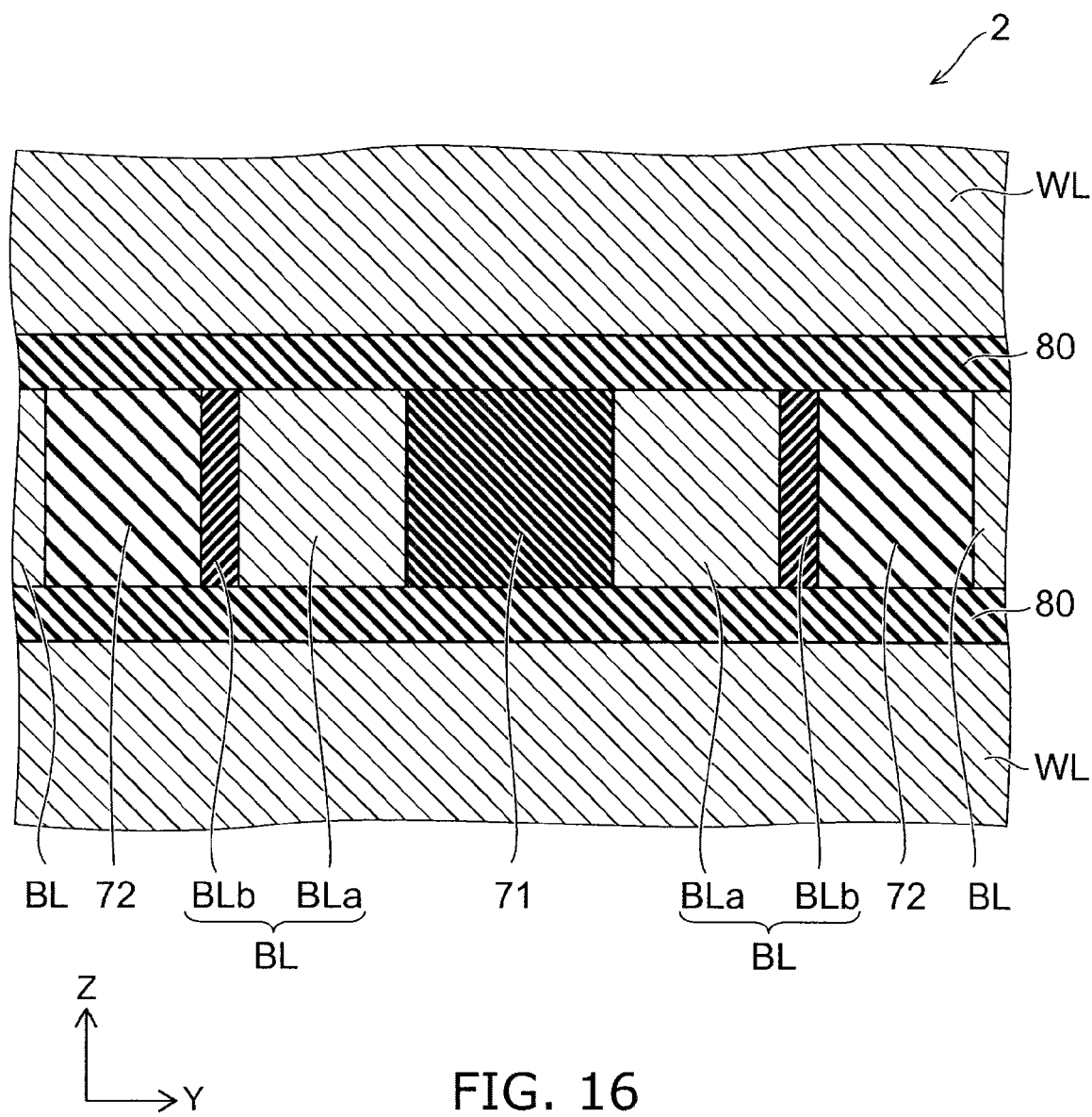
FIG. 16 is a cross-sectional view showing a region around resistance change layers of the memory device according to the second embodiment.

FIG. 16 is a cross-sectional view showing the region around resistance change layers of the memory device according to the embodiment.

The memory device according to the embodiment also is a CBRAM.

In the memory device 2 according to the embodiment as shown in FIG. 15 and FIG. 16, a word line interconnect layer 60 and a bit line interconnect layer 70 are stacked alternately along the vertical direction (the Z-direction); and a resistance change layer 80 is provided between the word line interconnect layer 60 and the bit line interconnect layer 70 as a continuous film spreading in the XY plane. The resistance change layer 80 is formed of, for example, silicon oxide. Although only two layers of the word line interconnect layers 60 and one layer of the bit line interconnect layer 70 are shown in FIG. 15, this is not limited thereto; and more word line interconnect layers 60 and bit line interconnect layers 70 may be stacked alternately.

In each of the word line interconnect layers 60, the multiple word lines WL that extend in the one direction (the Y-direction) are provided. The word lines WL are formed of, for example, tungsten, and function as opposing electrodes. A core member 61 is provided in every other space between the word lines WL; and an inter-layer insulating film 62 is provided in every other space between the word lines WL. The core member 61 and the inter-layer insulating film 62 are formed of, for example, silicon oxide or silicon nitride.

In each of the bit line interconnect layers 70, the multiple bit lines BL that extend in the one other direction (the X-direction) are provided. The bit lines BL correspond to the ion metal layers 15 of the first embodiment described above. In other words, the bit lines BL contain oxygen (O), the first metal that is ionized easily such that the ions are diffusible through the resistance change layer 80, and the second metal that is oxidized more easily than the first metal. The first metal is, for example, silver (Ag); and the second metal is, for example, titanium (Ti). In other words, the bit lines BL are formed of, for example, a silver-titanium alloy including oxygen. A core member 71 is provided in every other space between the bit lines BL; and an inter-layer insulating film 72 is provided in every other space between the bit lines BL. The core member 71 and the inter-layer insulating film 72 are formed of, for example, silicon oxide or silicon nitride.

Figure 17:
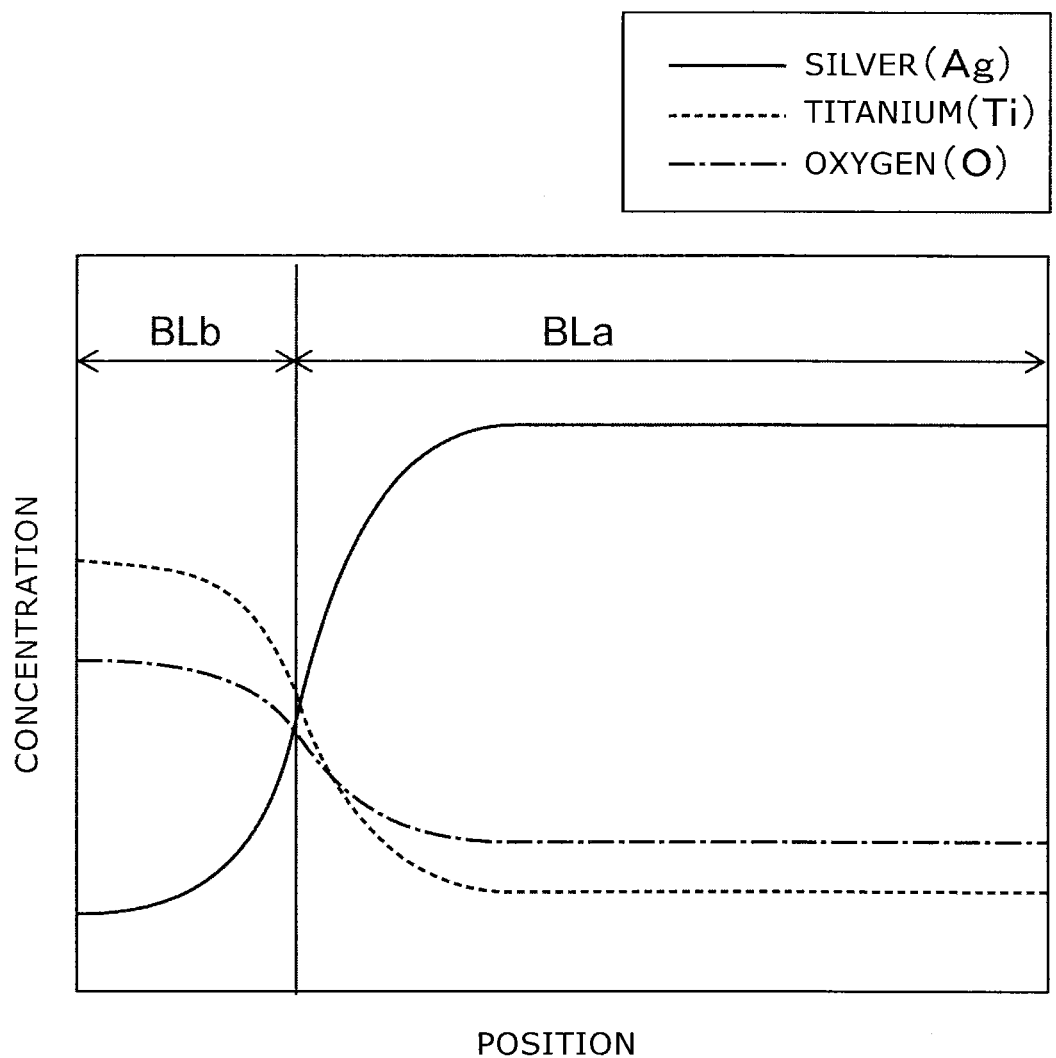
FIG. 17 is a graph showing a composition distribution of a bit line, in which the horizontal axis is the position in the Y-direction, and the vertical axis is the concentration.

FIG. 17 is a graph showing the composition distribution of the bit line, in which the horizontal axis is the position in the Y-direction, and the vertical axis is the concentration.

As shown in FIG. 17, the silver (Ag) concentration, the titanium (Ti) concentration, and the oxygen (O) concentration inside the bit line BL have distributions in the width direction (the Y-direction) of the bit line BL. In the Y-direction, the silver concentration is relatively low in one end portion BLb on the inter-layer insulating film 72 side of the bit line BL and is relatively high in a portion BLa of the bit line BL other than the one end portion BLb. The portion BLa includes an end portion of the bit line BL on the core member 71 side and a width-direction central portion of the bit line BL. Also, the titanium concentration and the oxygen concentration are relatively high in the one end portion BLb of the bit line BL and relatively low in the portion BLa of the bit line BL. In other words, much simple silver exists in the portion BLa of the bit line BL; and much oxidized titanium exists in the one end portion BLb of the bit line BL.

A method for manufacturing the memory device according to the embodiment will now be described.

FIG. 18 to FIG. 27 are perspective cross-sectional views showing the method for manufacturing the memory device according to the embodiment.

Figure 18:
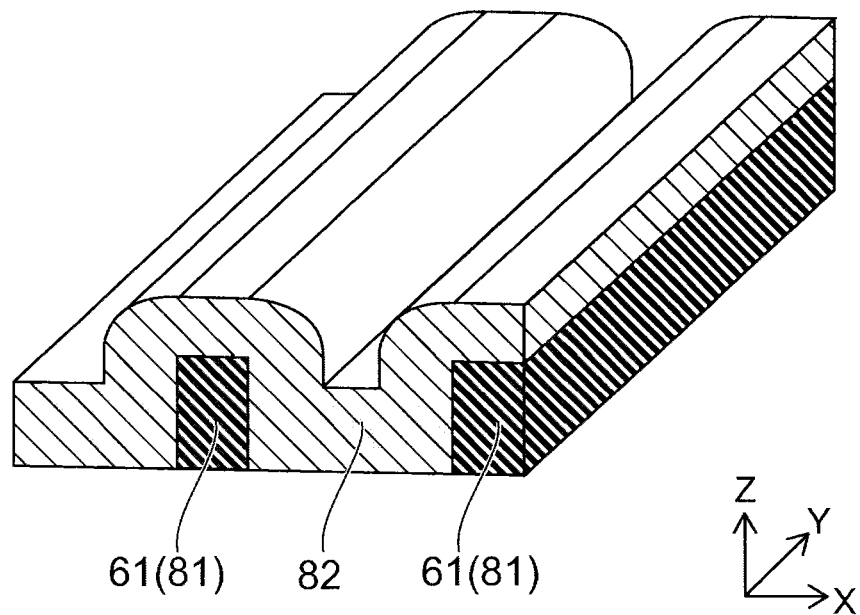
FIG. 18 to FIG. 27 are perspective cross-sectional views showing a method for manufacturing the memory device according to the second embodiment.

First, as shown in FIG. 18, an inter-layer insulating film (not shown) is formed on a silicon substrate (not shown); and an insulating film 81 that is made of an insulating material, e.g., silicon nitride, that is different from that of the inter-layer insulating film is formed on the inter-layer insulating film. Then, the insulating film 81 is patterned into a line-and-space configuration extending in the Y-direction by lithography. Thereby, the insulating film 81 is patterned into the multiple core members 61 extending in the Y-direction. Then, a conductive film 82 is formed on the entire surface by depositing, for example, tungsten. The conductive film 82 is formed to cover the core members 61; and the configuration of the conductive film 82 is a configuration that reflects the core members 61.

Figure 19:
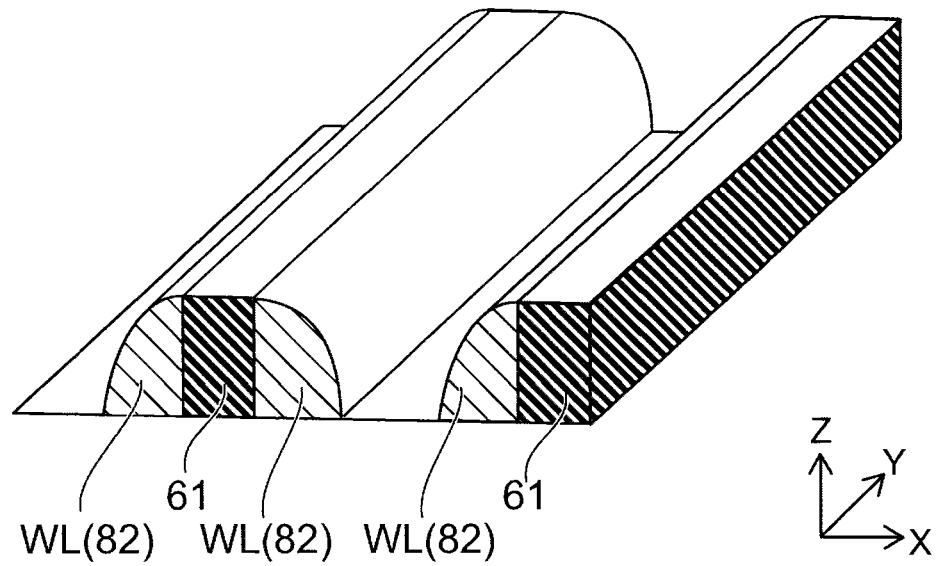

Then, as shown in FIG. 19, anisotropic etching such as RIE, etc., is performed. Thereby, the conductive film 82 is selectively removed to remain in a sidewall configuration on the two side surfaces of the core members 61. Thereby, the conductive film 82 is patterned into the multiple word lines WL extending in the Y-direction.

Figure 20:
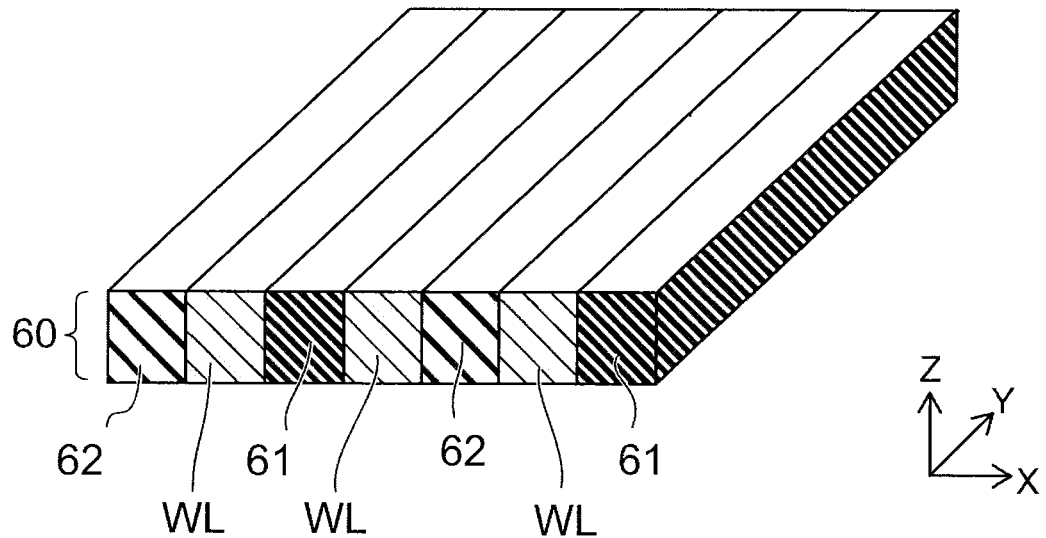

Then, as shown in FIG. 20, an insulating material is deposited on the entire surface. Then, the upper surface is planarized by performing CMP. Thereby, the upper portions of the core members 61 and the upper portions of the word lines WL are removed; and the inter-layer insulating film 62 is filled into the spaces between the word lines WL where the core members 61 are not disposed. As a result, the word line interconnect layers 60 are formed.

Figure 21:
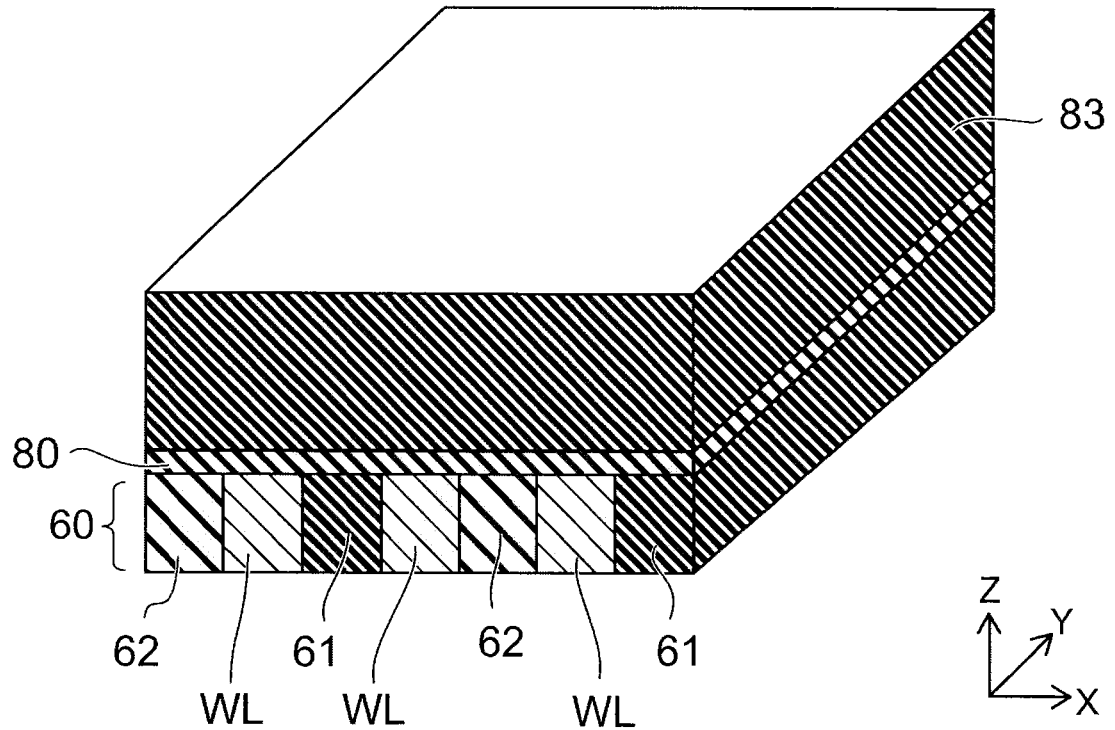

Then, as shown in FIG. 21, the resistance change layer 80 is formed on the entire surface of the word line interconnect layers 60. Then, an insulating film 83 that is made of an insulating material that is different from that of the resistance change layer 80 is formed on the entire surface of the resistance change layer 80.

Figure 22:
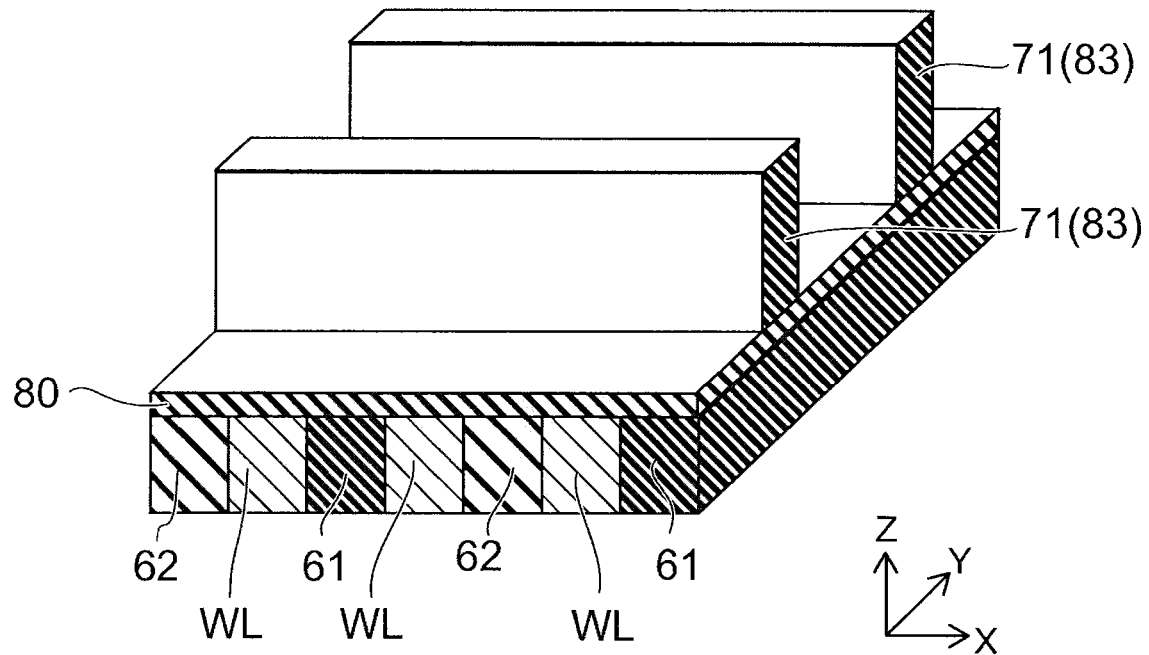

Then, as shown in FIG. 22, the insulating film 83 is patterned into a line-and-space configuration extending in the X-direction by lithography. Thereby, the insulating film 83 is patterned into the multiple core members 71 extending in the X-direction.

Figure 23:
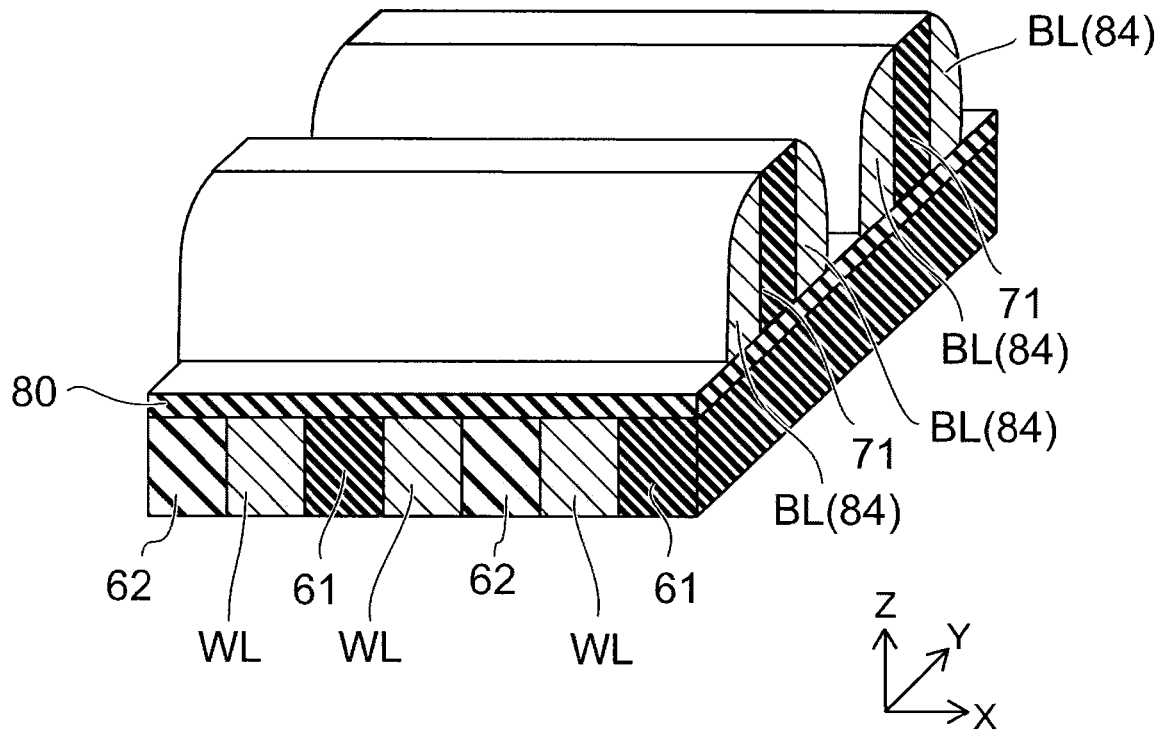

Then, as shown in FIG. 23, a conductive film 84 is formed on the entire surface by depositing, for example, a silver-titanium alloy. Then, anisotropic etching such as RIE, etc., is performed. Thereby, the conductive film 84 is selectively removed to remain in a sidewall configuration on the two side surfaces of the core members 71. As a result, the conductive film 84 is patterned into the multiple bit lines BL extending in the X-direction. At this time, in the region where the conductive film 84 is removed, the resistance change layer 80 is exposed and is damaged by RIE.

Then, oxidation treatment, e.g., a low-temperature thermal oxidation treatment at a temperature of not more than 400° C., is performed. Thereby, the exposed surface of the bit line BL, i.e., the region of the surface of the bit line BL from the upper surface to one side surface that is not in contact with the resistance change layer 80 and the core members 71 is oxidized; and the titanium of the one end portion BLb along this exposed surface is oxidized. Thereby, inside the bit line BL, the titanium segregates into the one end portion BLb; and the silver segregates into the portion BLa other than the one end portion BLb. As a result, the composition distribution along the width direction (the Y-direction) in the lower portion of the bit line BL becomes a distribution such as that shown in FIG. 17.

Figure 24:
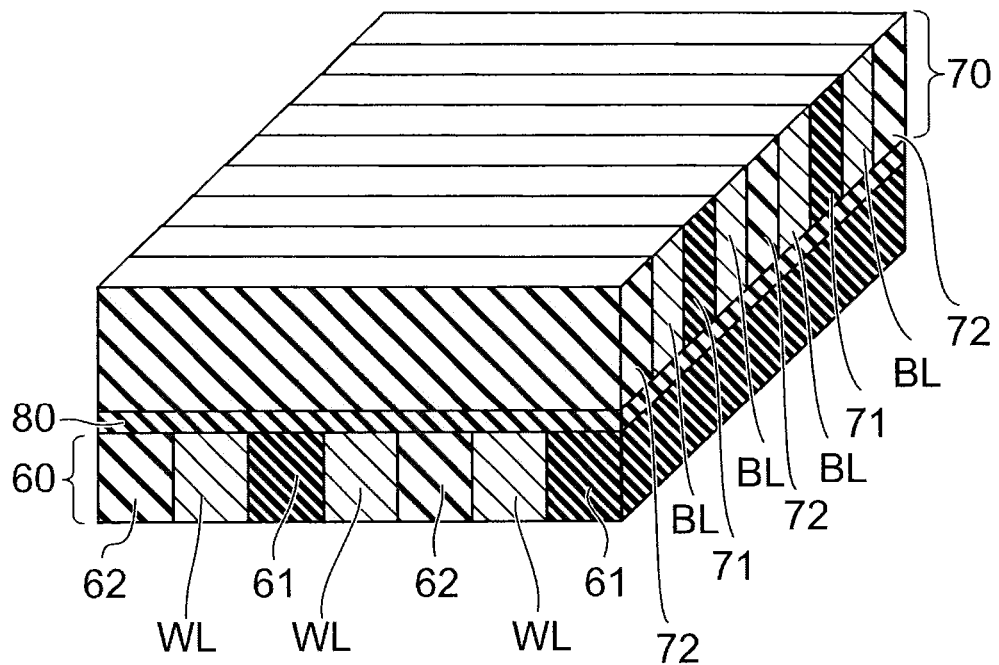

Then, as shown in FIG. 24, an insulating material is deposited on the entire surface. Then, the upper surface is planarized by performing CMP. Thereby, the upper portions of the core members 71 and the upper portions of the bit lines BL are removed; and the inter-layer insulating film 72 is filled into the space between the bit lines BL where the core members 71 are not disposed. As a result, the bit line interconnect layers 70 are formed.

Figure 25:
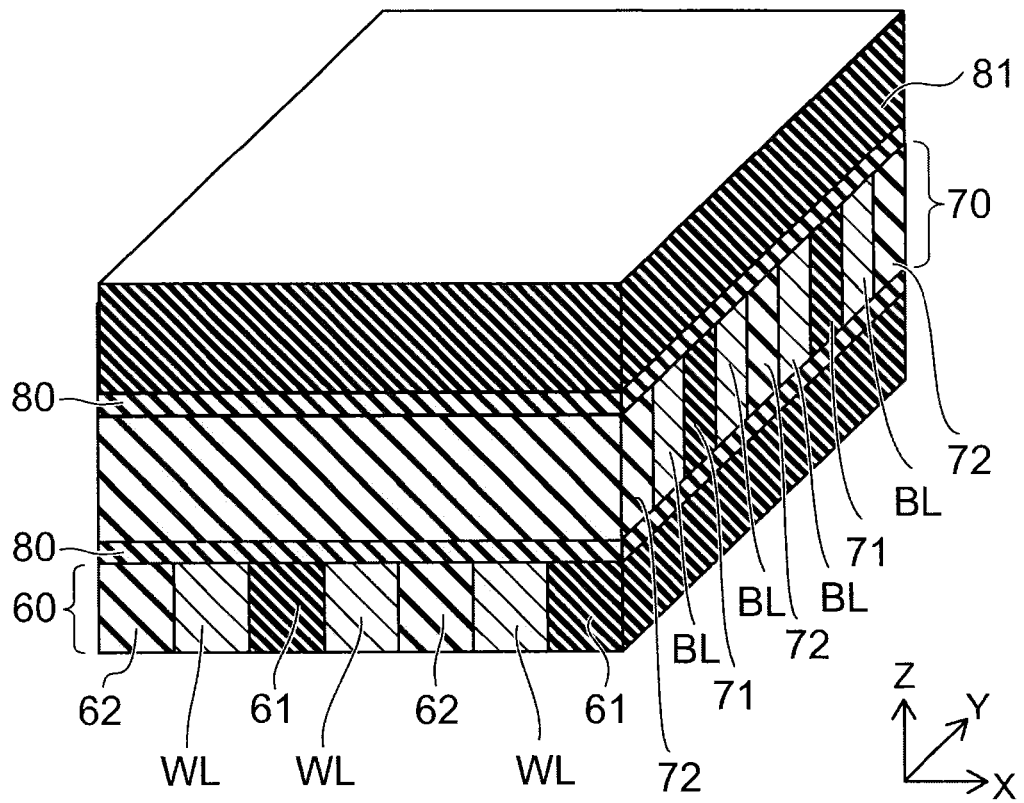

Then, as shown in FIG. 25, the resistance change layer 80 is formed on the entire surface of the bit line interconnect layer 70. Then, the insulating film 81 that is made of an insulating material that is different from that of the resistance change layer 80 is formed on the entire surface of the resistance change layer 80.

Figure 26:
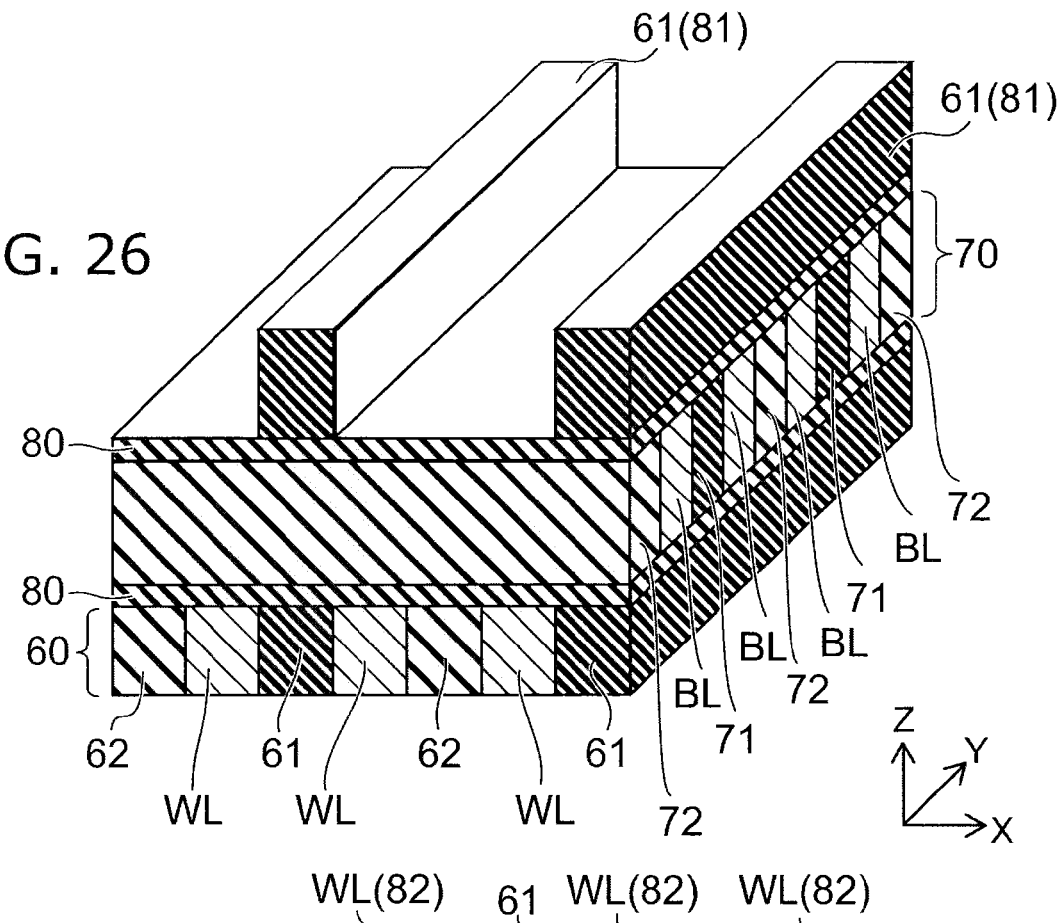

Then, as shown in FIG. 26, the insulating film 81 is patterned into a line-and-space configuration extending in the Y-direction by lithography. Thereby, the insulating film 81 is patterned into the multiple core members 61 extending in the Y-direction.

Figure 27:
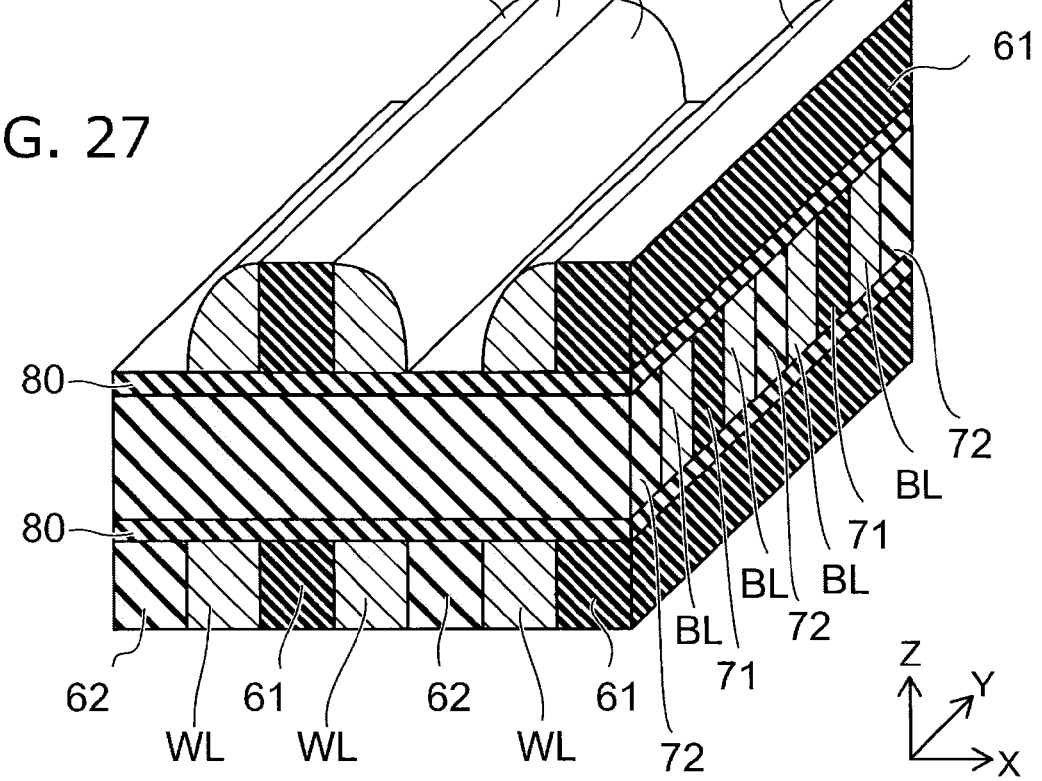

Then, as shown in FIG. 27, the conductive film 82 is formed on the entire surface by depositing, for example, tungsten. Then, anisotropic etching such as RIE, etc., is performed. Thereby, the conductive film 82 is selectively removed to be patterned into the multiple word lines WL extending in the Y-direction.

Then, as shown in FIG. 15, by depositing an insulating material on the entire surface and planarizing the upper surface by performing CMP, the upper portions of the core members 61 and the upper portions of the word lines WL are removed; and the inter-layer insulating film 62 is filled into the space between the word lines WL where the core members 61 are not disposed. As a result, the word line interconnect layers 60 are formed.

Thereafter, similarly, the memory device 2 according to the embodiment is manufactured by sequentially forming the resistance change layer 80, the bit line interconnect layer 70, the resistance change layer 80, and the word line interconnect layer 60.

Operations and effects of the embodiment will now be described.

Figure 28:
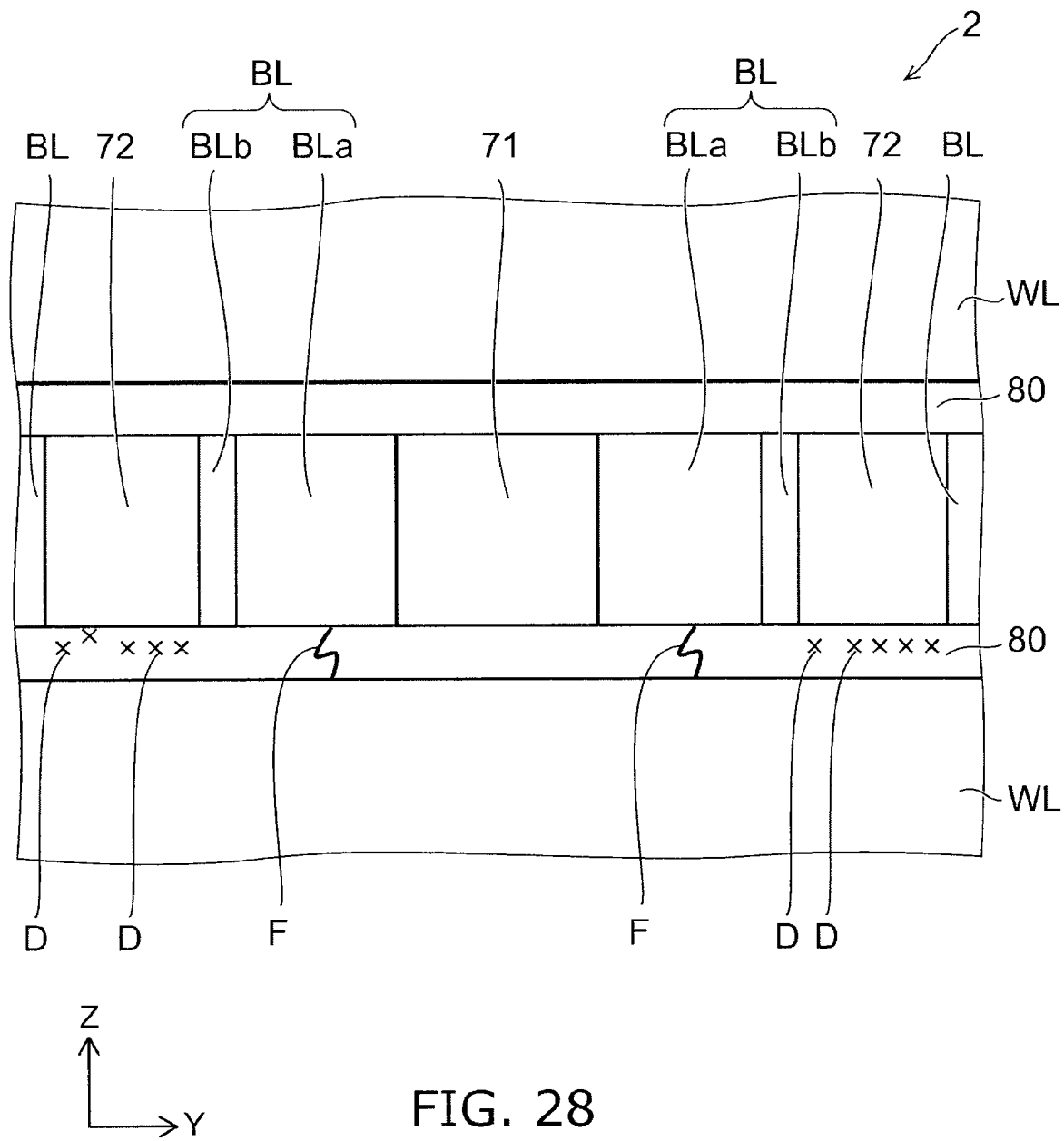
FIG. 28 is a schematic cross-sectional view showing an operation of the memory device according to the second embodiment.

FIG. 28 is a schematic cross-sectional view showing an operation of the memory device according to the embodiment.

When forming the bit lines BL by performing RIE of the conductive film 84 in the process shown in FIG. 23, the exposed surface of the resistance change layer 80 of the foundation, i.e., the region not covered with the core members 71 and the bit lines BL, is damaged. Thereby, as shown in FIG. 28, the damage D is introduced to the portion of the resistance change layer 80 not covered with the core members 71 and the bit lines BL.

Therefore, in the embodiment, oxidation treatment is performed after forming the bit line BL. Thereby, the titanium included in the bit line BL is oxidized at the one end portion BLb of the bit line BL on the side distal to the core member 71. Then, the titanium and the oxygen segregate into the one end portion BLb; and the silver that is not oxidized segregates into the portion BLa. As a result, the filament F is formed more easily in the portion of the resistance change layer 80 contacting the portion BLa when the positive voltage is applied between the bit line BL and the word line WL. In other words, the filament F can be formed at a position distal to the damage D inside the resistance change layer 80. Thereby, the switching characteristics stabilize.

Third Embodiment

A third embodiment will now be described.

Figure 29:
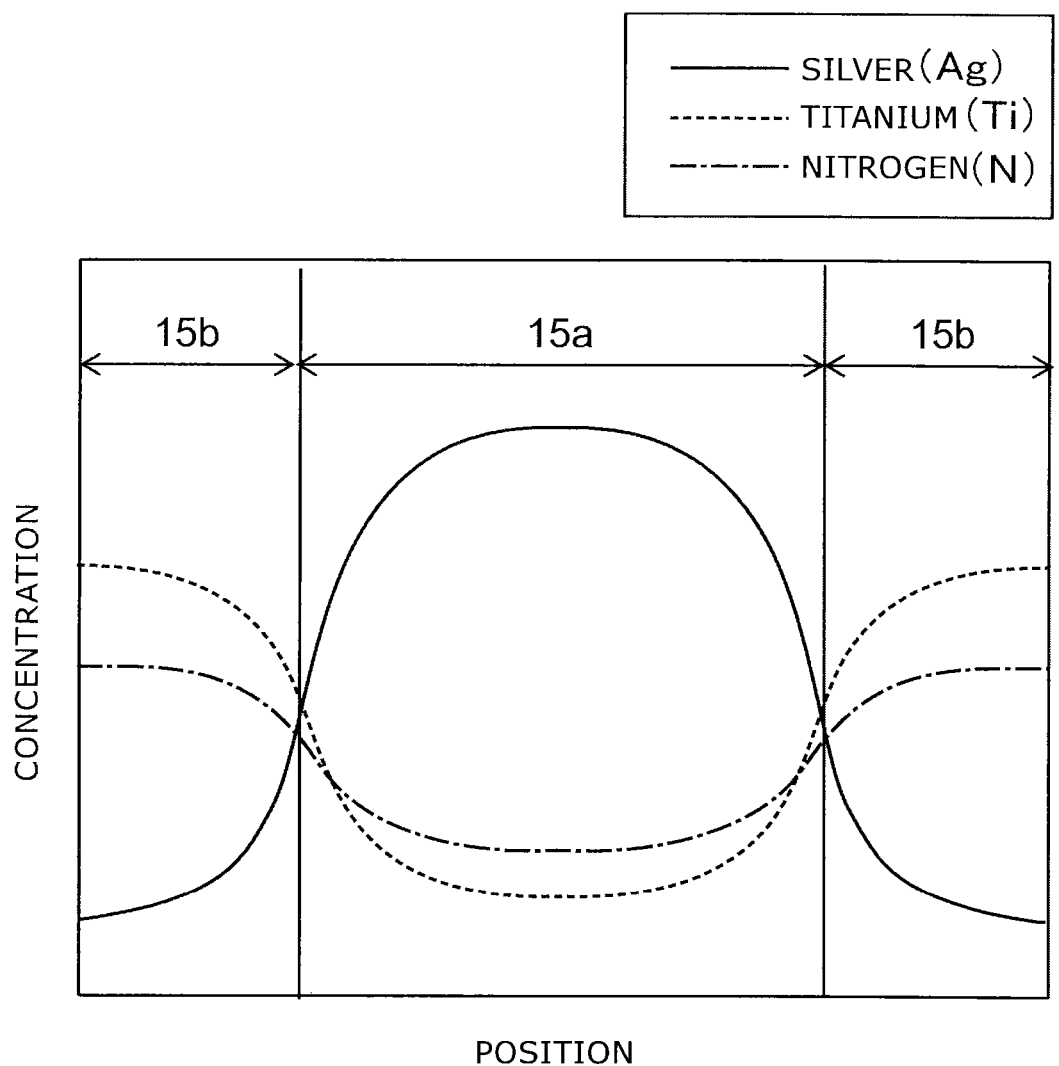
FIG. 29 is a graph showing a composition distribution of an ion metal layer of a third embodiment, in which the horizontal axis is the position in the X-direction and the Y-direction, and the vertical axis is the concentration.

FIG. 29 is a graph showing the composition distribution of the ion metal layer, in which the horizontal axis is the position in the X-direction and the Y-direction, and the vertical axis is the concentration.

Compared to the first embodiment described above, the embodiment is different in that the ion metal layer 15 (referring to FIG. 2) contains nitrogen (N), the first metal, and a second metal that is nitrided more easily than the first metal. The first metal is, for example, silver; and the second metal is, for example, titanium. Then, the concentration of silver is relatively high in the central portion 15a of the ion metal layer 15; and the concentrations of titanium and nitrogen are relatively high in the peripheral portion 15b of the ion metal layer 15. In other words, simple silver segregates into the central portion 15a; and titanium nitride segregates into the peripheral portion 15b. Such a structure can be formed by performing nitriding instead of the oxidation treatment of the method for manufacturing the memory device according to the first embodiment described above.

According to the embodiment as well, simple silver is caused to concentrate in the central portion 15a of the ion metal layer 15; and the filament can be formed in the central portion of the resistance change layer 14 (referring to FIG. 13) where there is little damage. Otherwise, the configuration, the manufacturing method, the operations, and the effects of the embodiment are similar to those of the first embodiment described above.

In the second embodiment described above as well, nitriding may be performed instead of oxidation treatment. Further, both oxidation treatment and nitriding may be implemented in the first to third embodiments.

Although an example is illustrated in each of the embodiments described above in which the ion metal layer or the bit line that functions as the ion metal layer is made of a silver-titanium alloy and the resistance change layer is made of silicon oxide, this is not limited thereto.

For example, it is sufficient for the second metal that bonds with silver to be a metal that oxidizes or nitrides more easily than silver, e.g., at least one type of metal selected from the group consisting of titanium (Ti), tantalum (Ta), hafnium (Hf), tungsten (W), molybdenum (Mo), palladium (Pd), copper (Cu), aluminum (Al), cobalt (Co), nickel (Ni), iridium (Ir), zinc (Zn), iron (Fe), ruthenium (Ru), niobium (Nb), zirconium (Zr), chrome (Cr), and yttrium (Y). Also, the metal to be ionized is not limited to silver and may be copper, etc.

The material of the resistance change layer may include, for example, a material including silicon such as amorphous silicon (a-Si), polysilicon (poly-Si), silicon oxide ($SiO_2$), silicon nitride ($Si_3N_4$), silicon oxynitride (SiON), etc., a transition metal oxide such as hafnium oxide ($HfO_x$), hafnium silicon oxide ($HfSiO_x$), hafnium silicon oxynitride (HfSiON), aluminum oxide ($AlO_x$), hafnium aluminum oxide ($HfAlO_x$) and zirconium oxide ($ZrO_x$), etc. As described above, the resistance change layer may be a stack of two or more layers of these materials. For example, a stack of different types of materials including silicon or a stack of a transition metal oxide and a material including silicon may be used.

According to the embodiments described above, a memory device and a method for manufacturing the memory device that have stable characteristics can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device, comprising:
    an ion metal layer containing a first metal and a second metal;
    an opposing electrode; and
    a resistance change layer disposed between the ion metal layer and the opposing electrode, the first metal being able to move repeatedly through an interior of the resistance change layer,
    a central portion of the ion metal layer containing both the first metal and the second metal, and an end portion of the ion metal layer containing both the first metal and the second metal, a concentration of the first metal in the central portion of the ion metal layer being higher than a concentration of the first metal in the end portion of the ion metal layer.

2. The memory device according to claim 1, wherein a concentration of the second metal in the end portion of the ion metal layer is higher than a concentration of the second metal in the central portion of the ion metal layer.

3. The memory device according to claim 1, wherein a concentration of oxygen in the end portion of the ion metal layer is higher than a concentration of oxygen in the central portion of the ion metal layer.

4. The memory device according to claim 1, wherein a concentration of nitrogen in the end portion of the ion metal layer is higher than a concentration of nitrogen in the central portion of the ion metal layer.

5. The memory device according to claim 1, wherein the second metal has a property of oxidizing more easily than the first metal.

6. The memory device according to claim 1, wherein the second metal has a property of nitriding more easily than the first metal.

7. The memory device according to claim 1, wherein the first metal is silver.

8. The memory device according to claim 7, wherein the second metal is at least one type of metal selected from the group consisting of titanium, tantalum, hafnium, tungsten, molybdenum, palladium, copper, aluminum, cobalt, nickel, iridium, zinc, iron, ruthenium, niobium, zirconium, chrome, and yttrium.

9. The memory device according to claim 1, wherein
    the ion metal layer has a pillar configuration, and
    the end portion is a peripheral portion provided around the central portion.

10. The memory device according to claim 1, wherein
    the ion metal layer has a line configuration, and
    the end portion is disposed on one side of the ion metal layer in a width direction of the ion metal layer.

* * * * *